(12) United States Patent
Hartig

(10) Patent No.: US 7,749,364 B2
(45) Date of Patent: Jul. 6, 2010

(54) COATER HAVING INTERRUPTED CONVEYOR SYSTEM

(75) Inventor: Klaus Hartig, Avoca, WI (US)

(73) Assignee: Cardinal CG Company, Eden Prairie, MN (US)

( * ) Notice: Subject to any disclaimer, the term of this patent is extended or adjusted under 35 U.S.C. 154(b) by 1307 days.

(21) Appl. No.: 11/214,663

(22) Filed: Aug. 29, 2005

(65) Prior Publication Data

US 2006/0048708 A1    Mar. 9, 2006

Related U.S. Application Data

(60) Provisional application No. 60/607,091, filed on Sep. 3, 2004, provisional application No. 60/644,139, filed on Jan. 7, 2005.

(51) Int. Cl.
*C23C 14/34* (2006.01)
*C23C 16/00* (2006.01)

(52) U.S. Cl. ............... 204/298.23; 204/298.24; 204/298.25; 204/298.26; 118/719; 118/718

(58) Field of Classification Search ............ 204/298.23, 204/298.24, 298.25, 298.26; 118/719, 718
See application file for complete search history.

(56) References Cited

U.S. PATENT DOCUMENTS

| | | | | |
|---|---|---|---|---|
| 1,848,102 A * | 3/1932 | Blair | ............................. | 65/163 |
| 2,975,753 A | 3/1961 | Hayes | ........................ | 118/718 |
| 3,528,906 A | 9/1970 | Cash | ........................... | 204/298 |
| 3,942,967 A | 3/1976 | Jack | ............................. | 65/114 |
| 3,968,018 A | 7/1976 | Lane | ........................... | 204/192 |
| 4,194,962 A | 3/1980 | Chambers | .................... | 204/298 |
| 4,765,273 A | 8/1988 | Anderle | ....................... | 118/729 |
| 4,780,190 A | 10/1988 | Vranken | ..................... | 204/298 |
| 4,890,714 A | 1/1990 | Brown | ......................... | 193/35 |
| 4,911,815 A * | 3/1990 | Kamei et al. | ........... | 204/298.25 |
| 5,097,794 A | 3/1992 | Mahler | ........................ | 118/719 |
| 5,228,553 A | 7/1993 | Herrmann | ................... | 198/624 |
| 5,538,610 A | 7/1996 | Gesche | .................. | 204/298.15 |
| 6,319,326 B1 | 11/2001 | Koh | ............................ | 118/718 |
| 6,681,916 B2 * | 1/2004 | Hiroki | ...................... | 198/347.1 |
| 2004/0089541 A1 | 5/2004 | Matsumoto | ............ | 204/298.08 |

FOREIGN PATENT DOCUMENTS

EP    1 179 516    7/2003
JP    53 74005 A    7/1978

OTHER PUBLICATIONS

Patent Abstracts of Japan vol. 2, No. 108 (E-055), Sep. 8, 1978 & JP 53 074005A (Matsushita Electric Ind Co Ltd), Jul. 1, 1978 abstract.

* cited by examiner

*Primary Examiner*—Rodney G McDonald
(74) *Attorney, Agent, or Firm*—Fredrikson & Byron, P.A.

(57) ABSTRACT

Methods and coaters for applying films onto a substrate (e.g., a large-area glass substrate) are disclosed. Certain embodiments involve a coater for applying thin films onto a sheet-like substrate. The coater in some embodiments has a transport system adapted for conveying the substrate along a path of substrate travel extending through the coater. The substrate transport system in certain embodiments includes an upward coating deposition gap. The coater preferably has a source of coating material adapted for delivering coating material upwardly through such gap and onto a bottom major surface of the substrate as the substrate is conveyed along a desired portion of the path of substrate travel, which portion of the path of substrate travel extends over the upward coating deposition gap.

53 Claims, 14 Drawing Sheets

COATER HAVING INTERRUPTED CONVEYOR SYSTEM

CROSS REFERENCE TO RELATED APPLICATIONS

The present application claims priority to provisional U.S. patent application filed Sep. 3, 2004 and assigned Ser. No. 60/607,091, and provisional U.S. patent application filed Jan. 7, 2005 and assigned Ser. No. 60/644,139, the entire disclosures of which are incorporated herein by reference.

FIELD OF THE INVENTION

The present invention relates to methods and coaters for applying coatings onto substrates. More particularly, this invention relates to methods and coaters for applying thin film coatings onto glass sheets and other sheet-like substrates.

BACKGROUND OF THE INVENTION

In the coated glass industry, it is common to apply one or more thin films onto one or both major surfaces of a glass sheet to impart desired properties in the coated glass. For example, in manufacturing coated glass for windows, it is advantageous to apply infrared-reflective coatings and one or more other coatings that provide hydrophilicity and/or photoactivity.

Insofar as infrared-reflective coatings are concerned, these coatings help provide comfortable interior climates within homes and other buildings. Human beings have a relatively narrow temperature range in which they are comfortable. Unfortunately, infrared (IR) energy from the sun entering a room through a window can quickly raise the temperature in the room to an uncomfortable level. Infrared-reflective coatings have been developed, inter alia, to prevent heat spikes in a room by reflecting some of the incident infrared energy. These coatings also help keep a room warm in the winter by reflecting back into the room some of the infrared energy that would otherwise escape through windows. Thus, infrared-reflective coatings help establish a comfortable living environment while reducing heating and air conditioning costs.

Insofar as hydrophilic and/or photocatalytic coatings are concerned, these coatings have been developed to provide low-maintenance properties for windows and other glazings. These coatings reduce the need for, and/or the effort involved in, cleaning the glass of windows, doors, skylights, and the like. Given the time and effort spent by the average homeowner on window cleaning, the advantages of a low-maintenance window are apparent. Moreover, when one considers the extensive measures and expense involved in cleaning the glass exteriors of modern skyscrapers, the upside of low-maintenance glass can be acutely appreciated.

The foregoing discussion of infrared-reflective coatings and coatings that are hydrophilic and/or photocatalytic is provided merely to exemplify one set of applications for which it is desirable to apply coatings onto both major surfaces of a pane or another sheet-like substrate. The present invention is by no means limited to the application of any particular coating(s). Rather, it has utility in applying a wide variety of thin film coatings. Moreover, the invention is not limited to embodiments in which both major surfaces of a sheet-like substrate are coated. To the contrary, the invention provides numerous embodiments in which only one major surface of the substrate is coated.

It would be desirable to provide methods and coaters in which various coatings can be applied upwardly onto the bottom major surface of a sheet-like substrate. It would be particularly desirable to provide methods and coaters in which coatings can be applied upwardly and downwardly (e.g., in a single pass of the substrate along a path of substrate travel extending through the coater), so as to facilitate rapid and efficient coating of both major surfaces of a sheet-like substrate. Methods and coaters of this nature would be particularly advantageous insofar as they involve applying one or more infrared-reflective films (e.g., a low-emissivity coating) downwardly onto a top major surface of the substrate, and applying another coating (e.g., a hydrophilic and/or photocatalytic coating) upwardly onto a bottom major surface of the substrate.

DETAILED DESCRIPTION

The following detailed description should be read with reference to the drawings, in which like elements in different drawings have corresponding reference numbers. In some cases, the reference numbers for like elements in different drawings are indexed by multiples of one hundred. The drawings, which are not necessarily to scale, depict selected embodiments and are not intended to limit the scope of the invention. Examples of constructions, materials, dimensions, and manufacturing processes are provided for selected elements. All other elements employ that which is known to those of skill in the field of the invention. Those skilled in the art will recognize that many of the examples provided have suitable alternatives that can be utilized.

Figure 1:
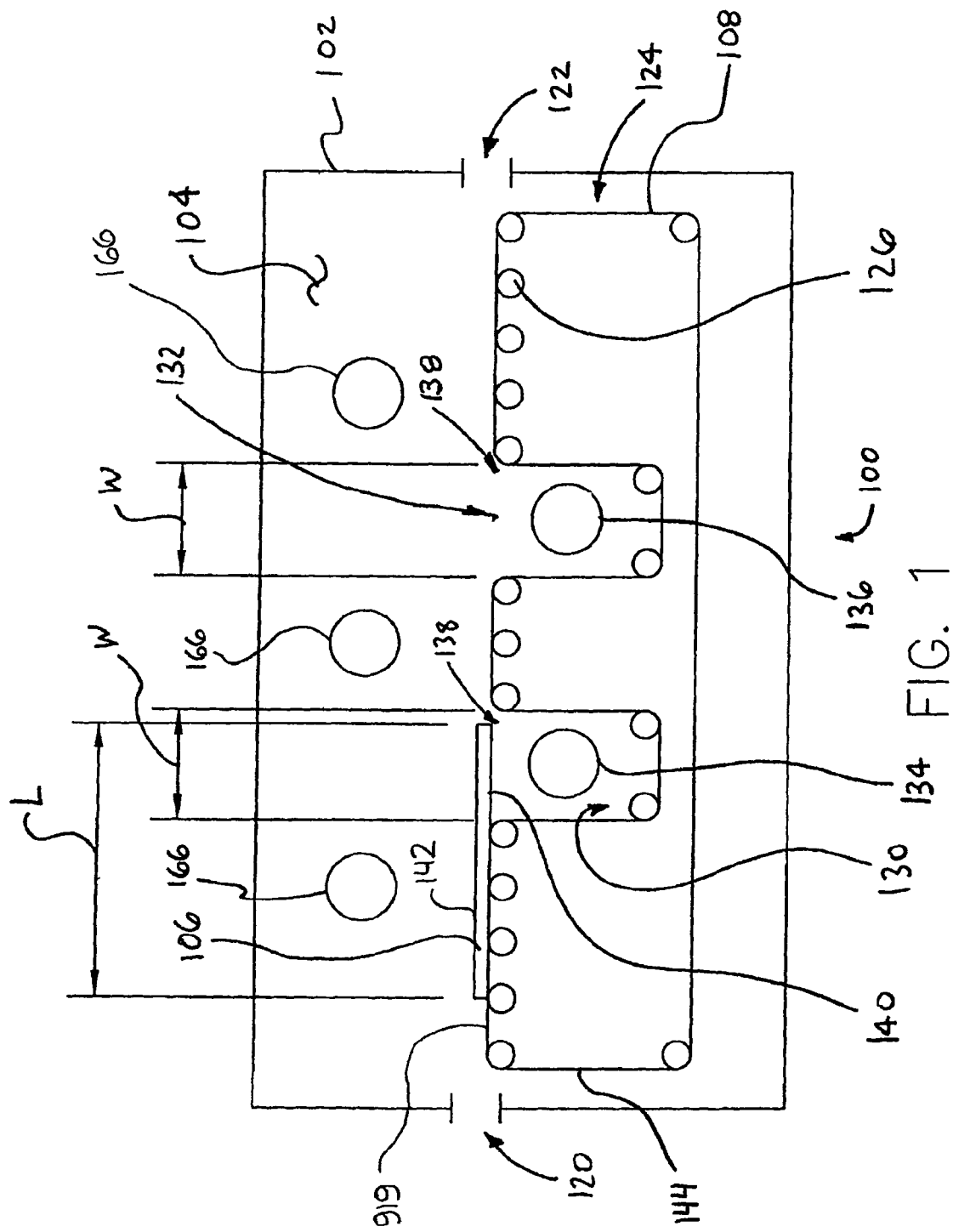
FIG. 1 is a somewhat diagrammatic side view of a coating system in accordance with an exemplary embodiment of the present invention.

FIG. 1 is a somewhat diagrammatic side view of a coating system or "coater" 100. Coating system 100 comprises at least one chamber 102 defining an interior cavity 104. In FIG. 1, a substrate 106 is shown disposed within the interior cavity 104 of the chamber 102. Here, the substrate is positioned on a substrate transport system 124 within the chamber. Thus, certain embodiments of the invention provide, in combination, a coater and at least one substrate, such combination optionally involving an arrangement (or assembly) in which the substrate is supported on a conveyor within the coater.

In some embodiments of the invention, the chamber 102 is capable of providing a controlled environment within the interior cavity 104. Preferably, the chamber 102 is adapted for establishing and maintaining a vacuous environment in the cavity 104. For example, the chamber 102 preferably is adapted for use at (e.g., is adapted for establishing and maintaining therein, and/or is operated while maintaining in the cavity) a total gas pressure of less than about 140 torr., more preferably less than about 0.1 torr., and perhaps most commonly between about 1 mtorr. and about 0.1 torr. (e.g., between about 1 mtorr. and about 30 mtorr.). In some particular embodiments, the preferred pressure range is between about 2 mtorr. and about 4.5 mtorr., such as between about 3.5 mtorr. and about 4.5 mtorr. Thus, in certain embodiments, the chamber 102 is provided with conventional gas delivery and pumping systems adapted for establishing and maintaining pressures within any range or ranges described in this paragraph.

With reference to FIG. 1, the chamber 102 defines a chamber entrance 120 and a chamber exit 122. Substrate 106 can be moved (e.g., conveyed) into the chamber 102 through the entrance 120 and through the chamber 102 by operating a substrate transport system 124. In the embodiment of FIG. 1, the transport system 124 has a conveyor loop 108. Substrate 106 is shown resting on (e.g., resting directly on a portion of) the conveyor loop 108 in FIG. 1. The conveyor loop 108 can comprise various elements without deviating from the spirit and scope of the present invention. Examples of elements that are suitable in some applications include; conveyor sheets, belts, cords, cables, straps, ropes, and chains. Certain preferred embodiments, for example, involve a conveyor loop comprising (e.g., consisting essentially of) a conveyor sheet or belt. In the embodiment of FIG. 1, the conveyor loop 108 is supported by a plurality of rotatable bodies 126. Thus, in FIG. 1, a portion (e.g., a top extent) of the conveyor loop 108 is shown interposed between (e.g., sandwiched between) the substrate 106 and a plurality of the rotatable bodies 126. This type of assembly can optionally be provided in any embodiment of the invention.

Figure 2A:
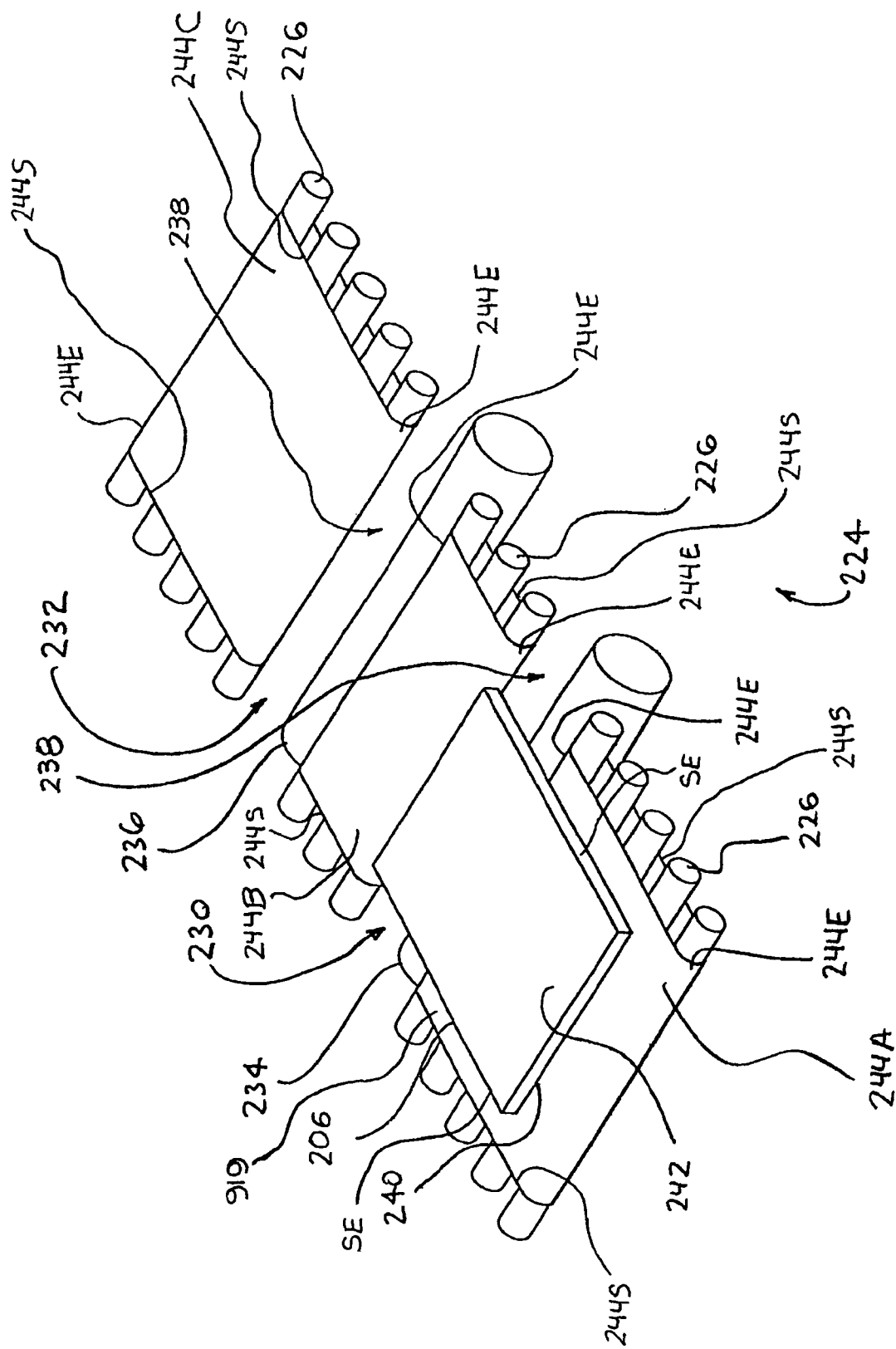
FIG. 2A is an isometric view of a substrate transport system in accordance with an exemplary embodiment of the present invention.

The substrate transport system 124, 224, 324, 524, 624, 1624 (or a portion thereof in a desired chamber of the coater) can have one conveyor loop, as exemplified in FIG. 1, or a plurality of conveyor loops, as exemplified in FIG. 2A. In embodiments of both types, the transport system preferably has a substrate conveyor that defines a path of substrate travel (which desirably extends between a chamber entrance and a chamber exit) and that has at least one upward coating deposition gap 138, 238, 338, 638, 1638. Each upward coating deposition gap preferably is an opening or "passage" through which coating material is delivered (and passes) upwardly from a source of coating material, which source preferably is below (i.e., at a lower elevation than) the path of substrate travel.

In embodiments involving at least two conveyor loops, the configuration of the substrate transport system preferably is such that a second of the conveyor loops is at a position entirely further along the path of substrate travel than a first of the conveyor loops, as exemplified in FIG. 2A. In certain embodiments of this nature, each conveyor loop has only one conveyor sheet, rather than having two or more conveyor cords defining a given loop. In some methods, two adjacent conveyor loops are operated so as to move at substantially the same speed.

As exemplified in FIG. 1, each upward coating deposition gap 138 preferably is located directly above (at least part of) a lower source of coating material 134, 136. Thus, when the substrate is at a desired location on the path of substrate travel, a gap of the described nature provides an opening or "passage" between the substrate's bottom major surface and a lower source of coating material (optionally such that a vertical axis passing through at least part of such lower source of coating material extends upwardly through such gap and also passes through the substrate). Having provided this relative positioning of the lower source of coating material, the gap, and the substrate, the lower source of coating material can be operated so as to deliver coating material upwardly through such gap onto the substrate's bottom surface.

Figure 12:
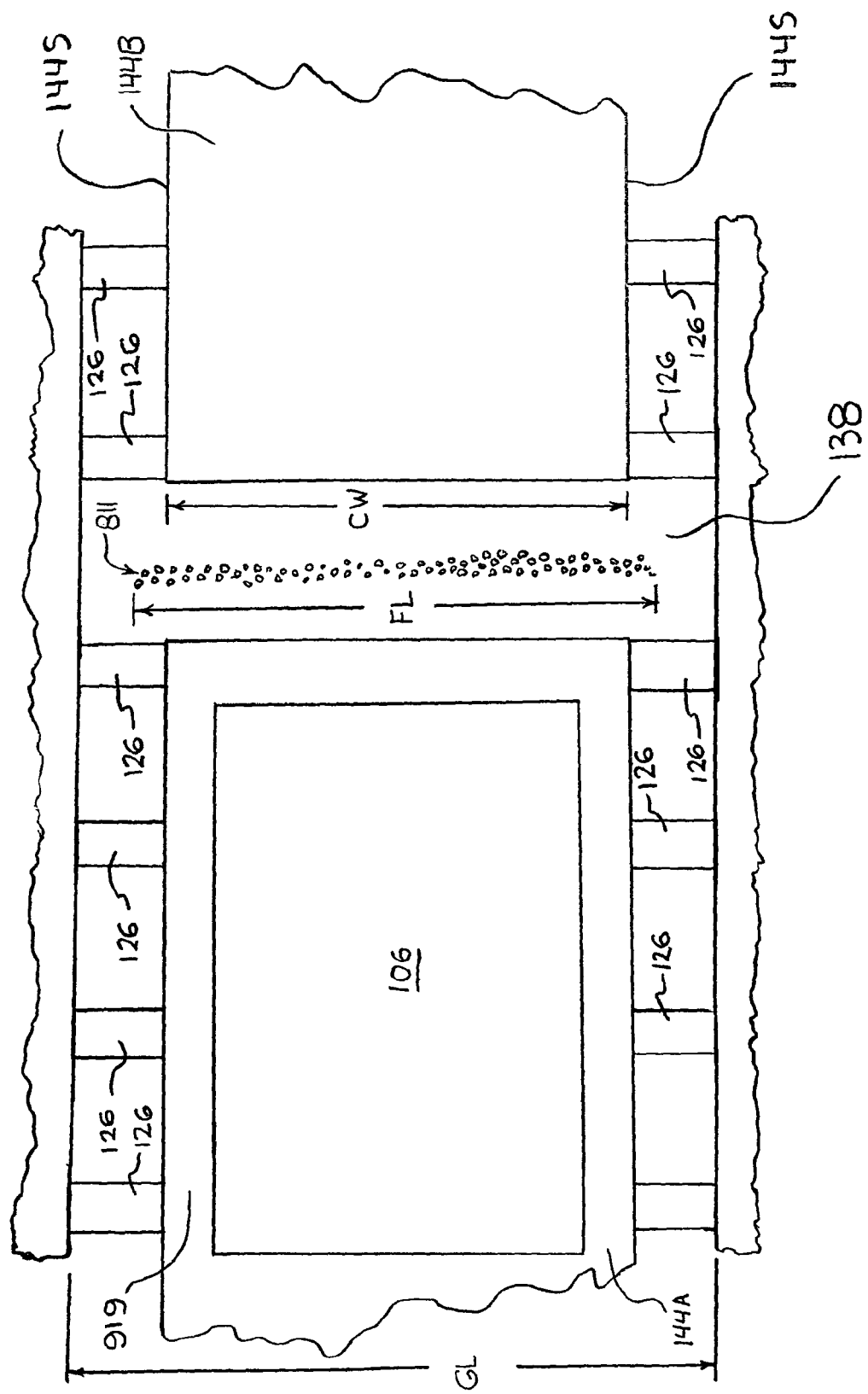
FIG. 12 is a broken-away, schematic top view of a coating system in accordance with an exemplary embodiment of the present invention.

Preferably, the substrate transport system has (e.g., defines) an upward coating deposition gap that allows the substrate's bottom major surface to be coated entirely. For example, such a gap preferably has a length GL (i.e., the major dimension of the gap along the lateral axis LA) that is at least as great as the substrate's width SW (i.e., the major dimension of the substrate along axis LA, when the substrate is operatively positioned on the transport system and/or when being conveyed through the coater). Further, the source of coating material beneath (e.g., directly beneath) such gap preferably is adapted for delivering a flux 811 of coating material having a length FL (i.e., the major dimension of the flux along axis LA) that is at least as great as the substrate's width, such that full-area coating of the substrate's bottom surface can be performed. Reference is made to FIG. 12. In certain embodiments, the lower source of coating material comprises a sputtering target having a length (i.e., the major dimension of the target along the lateral axis LA) that is at least 70% as great as the substrate's width SW.

In some embodiments, the present coaters and methods involve a conveyor sheet 144, 244 and a lower source of coating material 134, 136, 234, 334, 336, 534, 634, 1634 that is adapted for upwardly emitting a flux 811 of coating material having a length FL that is at least 50%, and perhaps optimally at least 80%, as great as the conveyor width CW.

It is anticipated that in some embodiments only a portion of the flux length FL will comprise enough coating material to reliably provide the desired continuous film on the substrate. In embodiments of this nature, any relative dimensioning involving the flux length can be advantageously based on this effective flux length. For example, the outermost end regions at opposed lateral sides of the flux distribution may comprise very small quantities of coating material (which may not be sufficient to form a continuous coating on the substrate), and therefore are preferably not counted as part of the effective flux length.

In some embodiments of the invention, the substrate transport system includes at least one upward coating deposition gap having a length GL of at least about 0.5 meter, preferably at least about 1 meter, perhaps more preferably at least about 1.5 meters (e.g., between about 2 meters and about 4 meters, such as between about 2.5 meters and about 3.5 meters), and perhaps optimally at least about 3 meters. The methods of the invention can optionally involve delivering coating material upwardly (e.g., from a lower source of coating material) through a gap having a length within any one or more of the ranges described in this paragraph. Embodiments of this nature are well suited for coating large-area substrates and thus are particularly advantageous.

Preferably, the transport system includes at least one upward coating deposition gap having a width W (i.e., the major dimension of the gap along the longitudinal axis LO) that is less than one half the length L (i.e., the major dimension of the substrate along axis LO, when the substrate is operatively positioned on the transport system and/or when being conveyed through the coater) of the substrate. This, however, is by no means required in all embodiments.

In certain embodiments, the transport system includes at least one upward coating deposition gap having a width W that is at least about 4 inches (e.g., between about 4 inches and about 12 inches), preferably at least about 6 inches, perhaps more preferably at least about 7 inches, and perhaps optimally at least about 8 inches (e.g., between about 10 inches and about 24 inches). The methods of the invention can optionally involve delivering coating material upwardly (e.g., from a lower source of coating material) through a gap having a width within any one or more of the ranges described in this paragraph.

Figure 10:
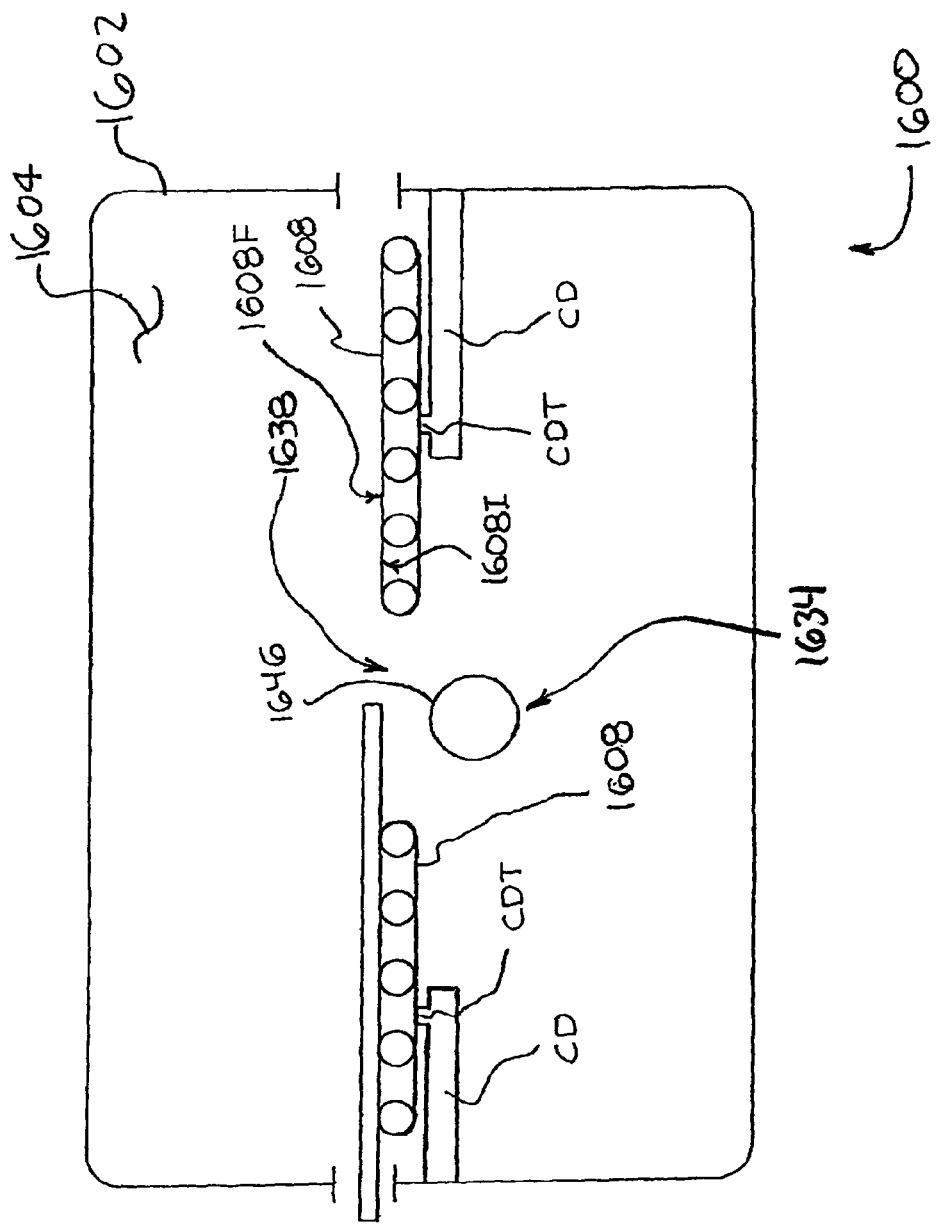
FIG. 10 is a somewhat diagrammatic side view of a coating system in accordance with an exemplary embodiment of the present invention.
Figure 11:
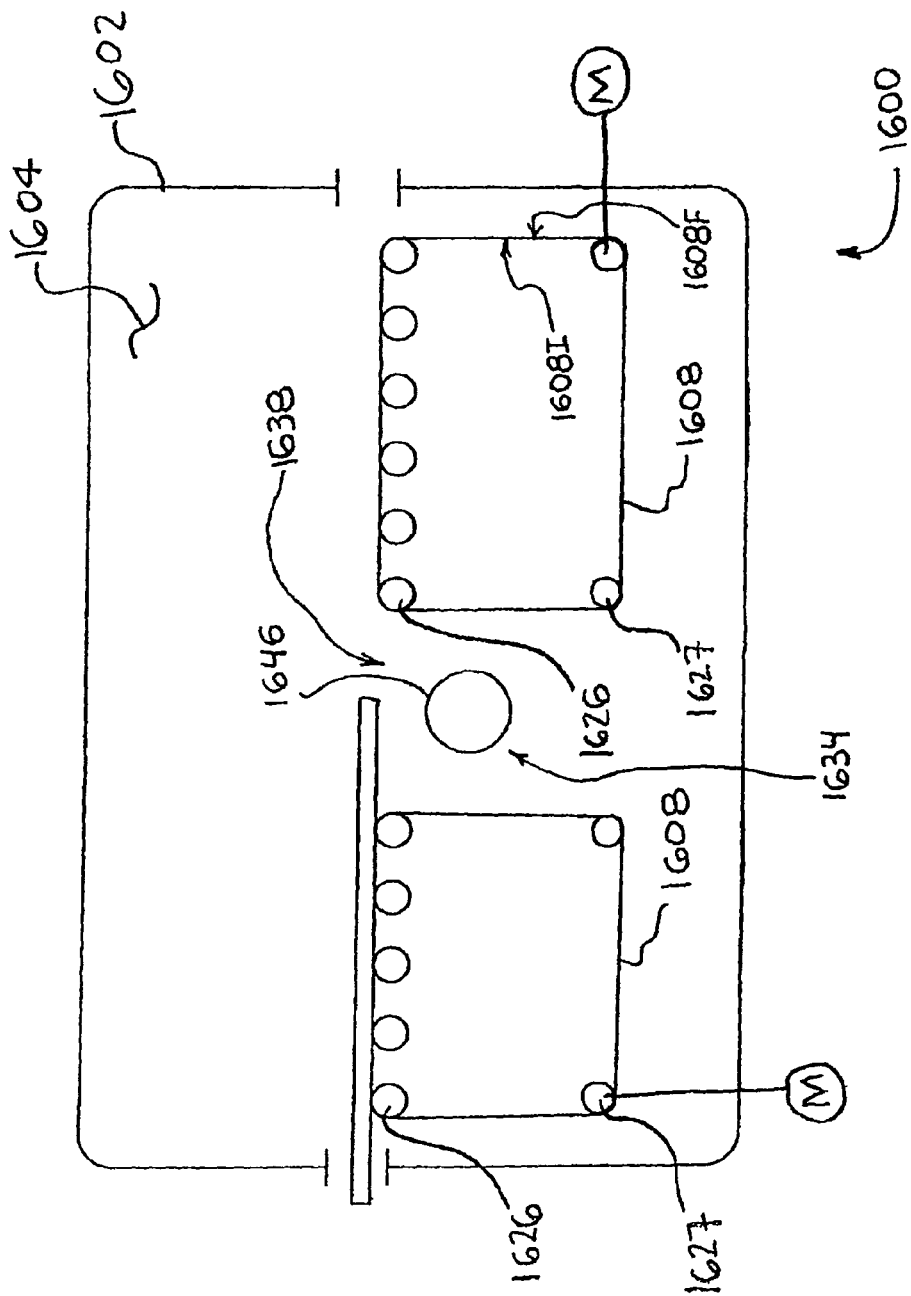
FIG. 11 is a somewhat diagrammatic side view of a coating system in accordance with an exemplary embodiment of the present invention.

With reference to FIG. 2A, the illustrated transport system has a substrate conveyor comprising a plurality of conveyor loops 244A, 244B, 244C. FIGS. 10 and 11 further exemplify such embodiments. In embodiments of this nature, the transport system preferably includes two conveyor loops separated by an upward coating deposition gap 238. Preferably, each such gap is located relative to a lower source of coating material 234, 236 such that the lower source of coating material is adapted for delivering coating material upwardly through the gap onto a bottom major surface 240 of the substrate 206 (e.g., as the substrate is conveyed along a desired portion of the path of substrate travel, which portion preferably extends over and past the gap). In certain preferred methods, the two conveyor loops of such an adjacent pair are operated so as to move at substantially the same speed (e.g., such that a substrate conveyed on either of the moving conveyor loops would have the same linear speed of conveyance). This can prevent damage caused to the coating on the bottom surface of the substrate that may otherwise be caused from abrasion due to adjacent conveyor loops moving at substantially different speeds.

Thus, some embodiments involve operating an adjacent pair of conveyor loops at the same (or substantially the same) speed. For example, each conveyor of such an adjacent pair can be operatively coupled with a motor (as exemplified in FIG. 11), and each such motor can be operated so as to move the conveyors at substantially identical speeds.

One method of the invention involves: (1) providing a coater that includes a plurality of upward coating chambers each having at least two conveyor loops separated by an upward coating deposition gap; (2) operating such conveyor loops so they move at substantially identical speeds; (3) conveying a substrate from a first of the conveyor loops in a selected one of the upward coating chambers to a second of the conveyor loops in that chamber; and (4) operating an upward coating device, provided beneath an upward coating deposition gap in the selected upward coating chamber, so as to deliver coating material upwardly through this gap onto a bottom major surface of the substrate (preferably so as to entirely coat the bottom surface of the substrate). Further, some preferred methods involve providing a coater having a substrate transport system that includes a plurality of (e.g., two or more, perhaps five or more, or even seven or more) conveyor loops wherein all of the conveyor loops are operated so as to move at substantially identical speeds. These methods can optionally be practiced with any coater embodiment described in the present disclosure.

Figure 2B:
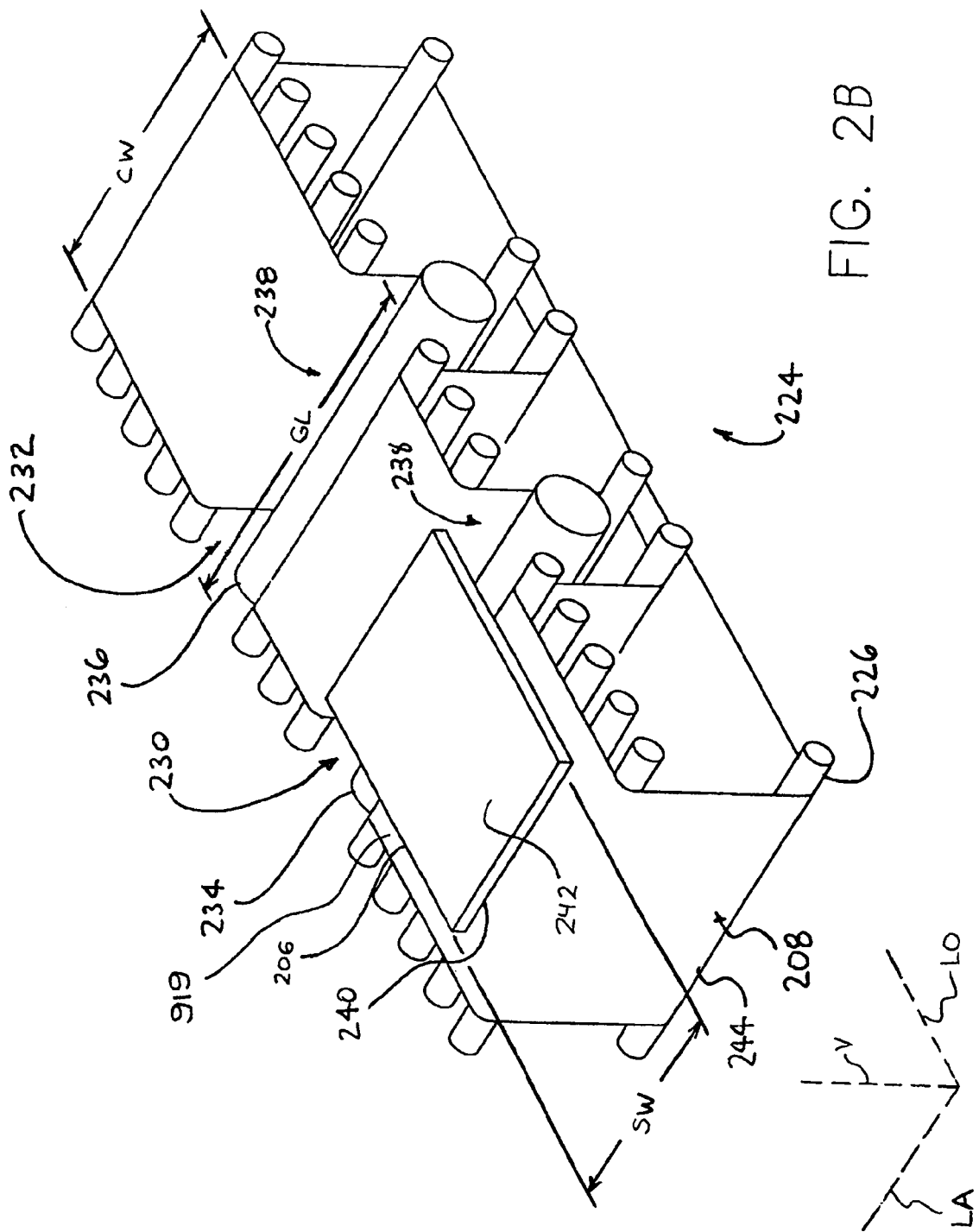
FIG. 2B is an isometric view of a substrate transport system in accordance with an exemplary embodiment of the present invention.

In some embodiments, each upward coating deposition gap is bounded by two confronting conveyor portions. For example, in FIG. 2A, each gap 238 is bounded by two conveyor ends 244E that confront each other. Here, the "conveyor length" of each gap 238 is the lateral distance from one side edge 244S of the conveyor sheet to the other side edge 244S of the conveyor sheet. In FIG. 2B, each gap 238 is bounded by two confronting, generally-vertical portions of the conveyor loop 208. The "conveyor length" of each gap 238 in FIGS. 2A and 2B is equal to the lateral dimension (i.e., the width CW) of the conveyor belt 244.

In FIGS. 2A and 2B, the substrate transport system includes one or more conveyor loops each comprising a conveyor sheet. In embodiments of this nature, the conveyor sheet can advantageously be configured so as to shield the bottom surface of the substrate against being overcoated during downward coating operations (e.g., when the substrate is conveyed through a downward coating chamber in which coating material is being delivered downwardly from an upper source of coating material onto the substrate's top surface). For example, the conveyor sheet in some embodiments has generally-opposed lateral side edges 114S, 244S between which the conveyor sheet forms a continuous (e.g., solid) wall devoid of gaps (or at least devoid of gaps having an area of 0.015625 square inch or more). In some embodiments, the conveyor sheet has generally-opposed lateral side edges 144S, 244S and a major surface (i.e., support surface 919) that is substantially entirely generally planar (i.e., substantially the entire area of surface 919 on which the substrate rests is generally planar). In these embodiments, when the bottom major surface of the substrate is positioned directly on the conveyor sheet's support surface 919, there is a lateral extent of contact between the support surface and the substrate's bottom surface. As exemplified in FIGS. 2A, 2B, and 12, this lateral extent of contact preferably extends entirely (or at least substantially entirely) between the lateral side edges of the conveyor sheet. Perhaps optimally, this complete lateral extent of contact spans the whole longitudinal extent of the contact between the substrate and the conveyor sheet (preferably, this is the case at all times during conveyance of the substrate). A conveyor having any one or more of the configurations described in this paragraph is defined as being a "shielding conveyor sheet". In some embodiments, the coater includes a plurality of (e.g., two or more, such as three or more, or even five or more) downward coating chambers each including at least one shielding conveyor sheet (or at least a certain length of one such sheet, such as where the conveyor sheet extends across two adjacent chambers). For example, in FIG. 13A, the conveyor loops 144B-144G can each comprise a shielding conveyor sheet. Further, conveyor loop 144A can additionally comprise a shielding conveyor sheet, and this represents a class of embodiments wherein a coater includes at least one downward coating chamber (e.g., a plurality of downward coating chambers) and at least one upward coating chamber (e.g., a plurality of upward coating chambers) and each of the chambers includes at least one shielding conveyor sheet (or at least a certain length of one such sheet). The coater in these embodiments preferably includes at least one upward coating chamber in which there is provided an upward coating deposition gap.

Figure 13A:
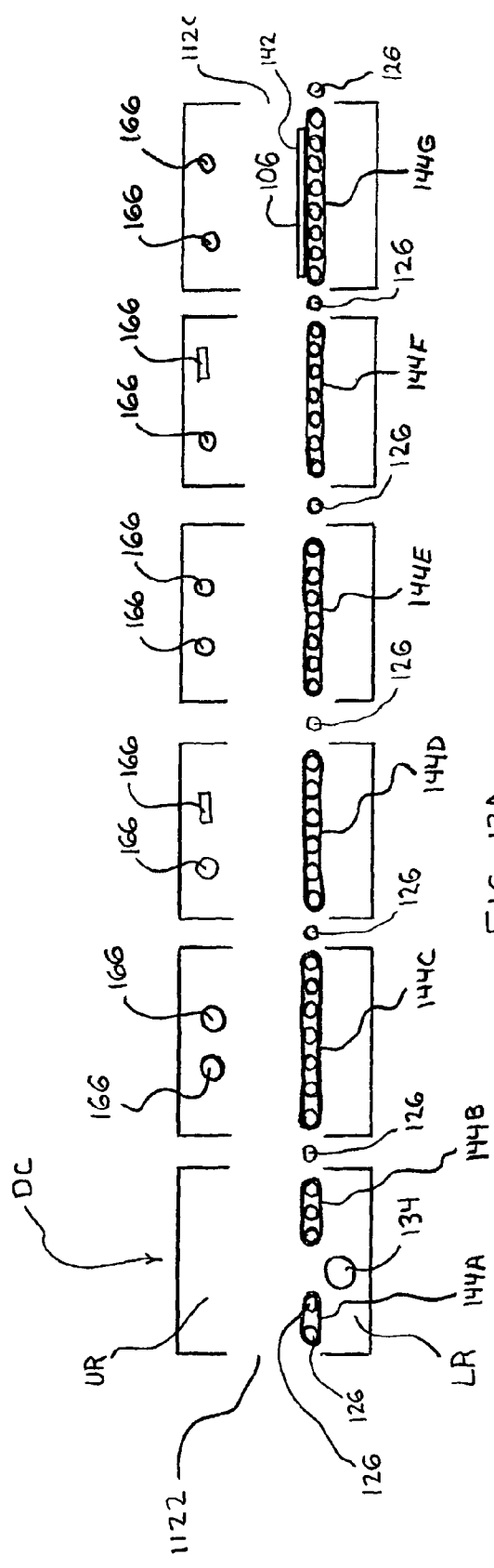
FIG. 13A is a schematic side view of a coating system in accordance with an exemplary embodiment of the present invention.

Reference will now be made to certain embodiments of the invention in which there is provided a method for applying thin films onto a sheet-like substrate. In the present embodiments, the method comprises: (1) providing a coater having a substrate transport system defining a path of substrate travel extending through the coater, the substrate transport system including first and second conveyor loops separated by an upward coating deposition gap, the coater having a lower source of coating material positioned below said gap; (2) positioning the substrate on the first conveyor loop; (3) operating the transport system so as to convey the substrate along the path of substrate travel from the first conveyor loop to the second conveyor loop, such that the substrate during this conveyance moves over the source of coating material; and (4) operating the coater so as to deliver coating material upwardly from the lower source of coating material through the gap onto a bottom major surface of the substrate. In some methods of this nature, the coater includes a series of thin film deposition apparatuses positioned on a common side of the path of substrate travel such that the deposition apparatuses of the series are above the path of substrate travel, the deposition apparatuses of the series being operated so as to deposit a low-emissivity coating on a top major surface of the substrate. Reference is made to FIG. 13A, which illustrates one particular coater that can be used to deposit a low-emissivity coating downwardly onto a top major surface of the substrate 106. Preferably, the operation of the series of deposition apparatuses includes depositing at least one silver-containing film on the top major surface of the substrate. In FIG. 13A, for example, the two upper sources of coating material 166 that are depicted with rectangles can optionally be planar silver-containing sputtering targets (i.e., targets containing at least some silver, preferably consisting essentially of silver). Preferably, the lower source of coating material is either located at a position further along the path of substrate travel than the deposition apparatuses of the noted series or the deposition apparatuses of the noted series are located at a position further along the path of substrate. The former arrangement is exemplified in FIG. 13A, where the lower source of coating material 134 is depicted as being in the last chamber of the coater.

In certain embodiments of the invention, there is provided coater for applying thin films onto two generally-opposed major surfaces of a sheet-like substrate. In these embodiments, the coater has a substrate transport system adapted for conveying the substrate along a path of substrate travel extending through the coater, the substrate transport system including two conveyor loops separated by an upward coating deposition gap, the coater having an upper source of coating material positioned above the path of substrate travel and a lower source of coating material positioned below the path of substrate travel, the upper source being adapted for delivering coating material downwardly toward the path of substrate travel, the lower source being adapted for delivering coating material upwardly through the gap toward the path of substrate travel. In some coater embodiments of this nature, the coater includes a series of thin film deposition apparatuses positioned on a common side of the path of substrate travel such that the deposition apparatuses of the noted series are either above or below the path of substrate travel, the deposition apparatuses of the noted series being adapted to deposit a low-emissivity coating on the substrate. One such coater embodiment is exemplified in FIG. 13B. In some preferred embodiments of this nature, the deposition apparatuses of the noted series are positioned above the path of substrate travel.

Optionally, the series of deposition apparatuses includes at least one apparatus adapted for depositing a silver-containing film on the substrate. In the present coater embodiments, the noted series of deposition apparatuses can advantageously include sputtering targets. For example, each deposition apparatus 134, 166 in the coater can comprise a sputtering target.

Figure 13B:
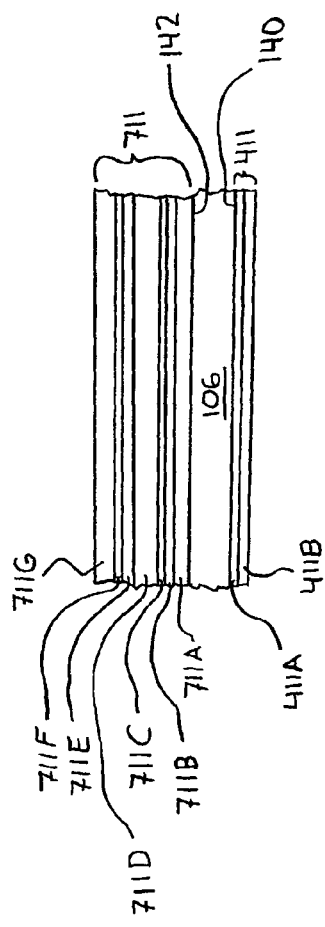
FIG. 13B is a partially broken-away side view of a substrate coated in accordance with an exemplary embodiment of the present invention.

FIG. 13B depicts a coated substrate 106 that can be produced using the method and coater of FIG. 13A. Here, the substrate 106 has on its first major surface 140 a first coating 411. This can be any desired coating type. In some embodiments, this coating 411 is a hydrophilic and/or photocatalytic coating. For instance, film region 411A can comprise sputtered a sputtered blocker film, such as silica, at less 100 angstroms, while film region 411B can comprise a sputtered titania-containing film at less than 150 angstroms. The coating 711 on the substrate's second surface 142 can also be any desired coating type. In some embodiments, this coating 711 is a low-emissivity coating. For instance, film region 711A can be a sputtered dielectric film, such as zinc oxide, at a thickness of between about 75 angstroms and about 300 angstroms, film region 711B can be a sputtered silver-containing film, such as essentially pure silver, at a thickness of between about 65 angstroms and about 150 angstroms, film region 711C can be a thin sputtered metal-containing layer, such as a titanium-containing layer (which may be oxidized at least over a certain outermost thickness), at a thickness of between about 5 angstroms and about 30 angstroms, film region 711D can be sputtered dielectric film, such as five alternating layers of zinc oxide and silicon nitride, at a total thickness of between about 400 angstroms and about 900 angstroms, film region 711E can be a sputtered silver-containing film, such as essentially pure silver, at a thickness of between about 65 angstroms and about 150 angstroms, film region 711F can be a thin sputtered metal-containing layer, such as a titanium-containing layer (which may be oxidized at least over a certain outermost thickness), at a thickness of between about 5 angstroms and about 30 angstroms, and film region 711B can be a sputtered dielectric film, such as zinc oxide, at a thickness of between about 75 angstroms and about 400 angstroms.

Turning now to the embodiment of FIG. 1, conveyor loop 108 defines a first pocket 130 and a second pocket 132. In some embodiments, first pocket 130 and second pocket 132 are each dimensioned to receive a coating material source (e.g., a coating apparatus). In the embodiment of FIG. 1, a first coating material source 134 is disposed in first pocket 130 and a second coating material source 136 is disposed in second pocket 132. It is to be understood, however, that loop 108 can form any number of (e.g., one or more) pockets.

With continued reference to FIG. 1, it will be appreciated that each pocket has an opening (or "gap" or "passage") 138 through which coating material is delivered when such coating material is deposited onto a first side 140 of substrate 106. Various thin film deposition apparatuses and processes can be used to deposit coating material(s) from first coating material source 134 and second coating material source 136 onto the first side 140 of the substrate 106. Examples of thin film deposition apparatuses and processes that can be used include: sputter deposition, ion-assisted deposition, chemical vapor deposition, physical vapor deposition, and/or vacuum evaporation.

In FIG. 1, the width W of each opening or "gap" 138 is illustrated with dimension lines. As noted above, in some useful embodiments of the invention, the gap width W is selected to be less than one half the major dimension of the desired (e.g., selected) substrate 106. In FIG. 2A, the major dimension of the substrate 106 is its length L, and the width W of each gap 138 preferably is less than one half the length L of the substrate, which also is shown with dimension lines in FIG. 1. The present invention provides certain embodiments of this nature involving: (1) methods of coating at least the substrate's bottom surface, in which the noted relative dimensions are selected; and (2) combinations of a substrate (e.g., a glass sheet) and a coater having a transport system with an upward coating deposition gap, wherein the noted relative dimensions are provided.

The substrate transport system preferably defines a path of substrate travel extending through the chamber. Further, in preferred embodiments, the chamber is part of a coater or coating line that comprises a plurality of chambers (which may be connected in series) through which the substrate can be conveyed sequentially. In such embodiments, the path of substrate travel typically extends through all the chambers of the coater (e.g., between a coater entrance 1120 and a coater exit 1122), and the transport system typically is operated so as to convey the substrate sequentially through each deposition chamber of such a coater (optionally, the substrate is conveyed at substantially the same speed through the coater).

FIG. 2B is an isometric view of a substrate transport system 224 in accordance with an exemplary embodiment of the present invention. Transport system 224 comprises a conveyor loop 208 that is supported by a plurality of rotatable bodies 226. In the embodiment of FIG. 2B, conveyor loop 208 comprises a conveyor belt or sheet 244. In FIG. 2B, the conveyor belt or sheet 244 is shown supporting a substrate 206. Substrate 206 can be transported (e.g., conveyed) through a chamber by operating the transport system 224.

In FIG. 2B, conveyor belt or sheet 244 defines a first pocket 230 and a second pocket 232. A first coating material source 234 is disposed in first pocket 230 and a second coating material source 236 is disposed in second pocket 232. Material from each coating material source can be deposited on a first side (e.g., on a first major surface) 240 of substrate 206 to form a first coating. As shown in FIG. 2B, each pocket has an opening (or "gap" or "passage") 238 through which coating material can be delivered (e.g., upwardly) when such coating material is deposited onto the first side 240 of the substrate 206.

In some preferred embodiments, the coating delivered upwardly onto the substrate's bottom major surface has a particularly small total thickness, such as less than about 750 angstroms, perhaps more preferably less than about 500 angstroms, and perhaps optimally less than about 300 angstroms (e.g., between about 40 angstroms and about 250 angstroms, such as between about 40 angstroms and about 100 angstroms, and in some cases between 45 angstroms and 95 angstroms). In certain embodiments, this coating (or at least one film region of this coating) comprises (e.g., consists essentially of) titanium oxide at a thickness within one or more of these ranges. The features described in this paragraph can optionally be provided in methods of the invention regardless of which coater embodiments are employed.

Figure 3:
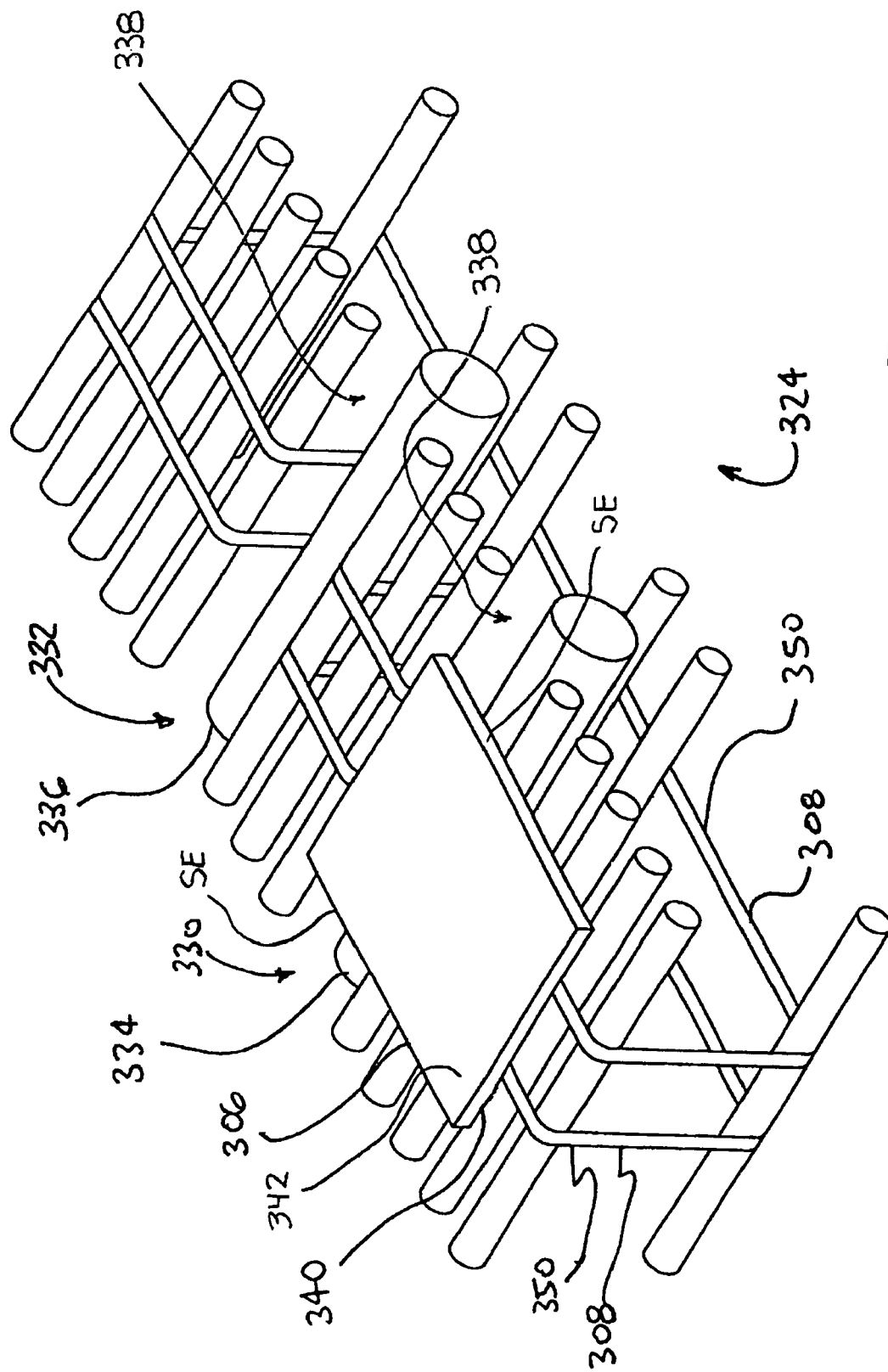
FIG. 3 is an isometric view of a substrate transport system in accordance with an exemplary embodiment of the present invention.

FIG. 3 is an isometric view of a substrate transport system 324 in accordance with an additional exemplary embodiment of the present invention. Here, the transport system 324 comprises a plurality of loops 308 supported by a plurality of rotatable bodies 326. In the embodiment of FIG. 3, each loop 308 comprises a cord 350. Each cord 350 can comprise various elements without deviating from the spirit and scope of the invention. In certain embodiments, each cord 350 comprises a flexible strap or a flexible cable (e.g., that can be readily wound without breaking). For example, each cord 350 can comprise a plurality of thermoplastic fibers (e.g., KEVLAR fibers), optionally forming a strap, cable, and/or being in a woven configuration. In a second example, each cord 350 comprises a chain having a plurality of links. In one embodiment of this nature, the chain is mounted on at least one rotatable sprocket (e.g., each on at least one of the rotatable bodies 326), such that rotating the sprocket(s) drives the chain. In some embodiments, the cords 350 each have a length at least 10 times (and perhaps more preferably at least 100 times) as great as the lateral dimension (e.g., the thickness or "width") of the cord. In the exemplary embodiment of FIG. 3, the substrate support is defined by two laterally spaced-apart cords 350. In certain methods and coater-substrate combinations, a substrate having two generally-opposed, generally-parallel side edges SE is positioned on such a substrate support so that each cord 350 directly supports a side area of the substrate's bottom major surface 340, as shown in FIG. 3. If so desired, each cord can comprise a plurality of metal fibers (which may be weaved together or otherwise intermeshed or intertwined), optionally forming a soft (e.g., flexible and/or fabric-like) cord, which can advantageously be band-like or rope-like.

In FIG. 3, the substrate 306 is shown resting on the cords 350. In some methods in accordance with the present invention, the substrate 306 is transported through a deposition chamber by operating the transport system 324. In FIG. 3, cords 350 define, bound, or otherwise delineate a first pocket 330 and a second pocket 332. A first coating material source 334 and a second coating material source 336 are disposed in first pocket 330 and second pocket 332, respectively. First coating material source 334 and second coating material source 336 can be used (e.g., operated) to deposit coating material onto a first side 340 of the substrate 306. Preferably, the first side of the substrate is generally downwardly facing when it is being coated.

Figure 4:
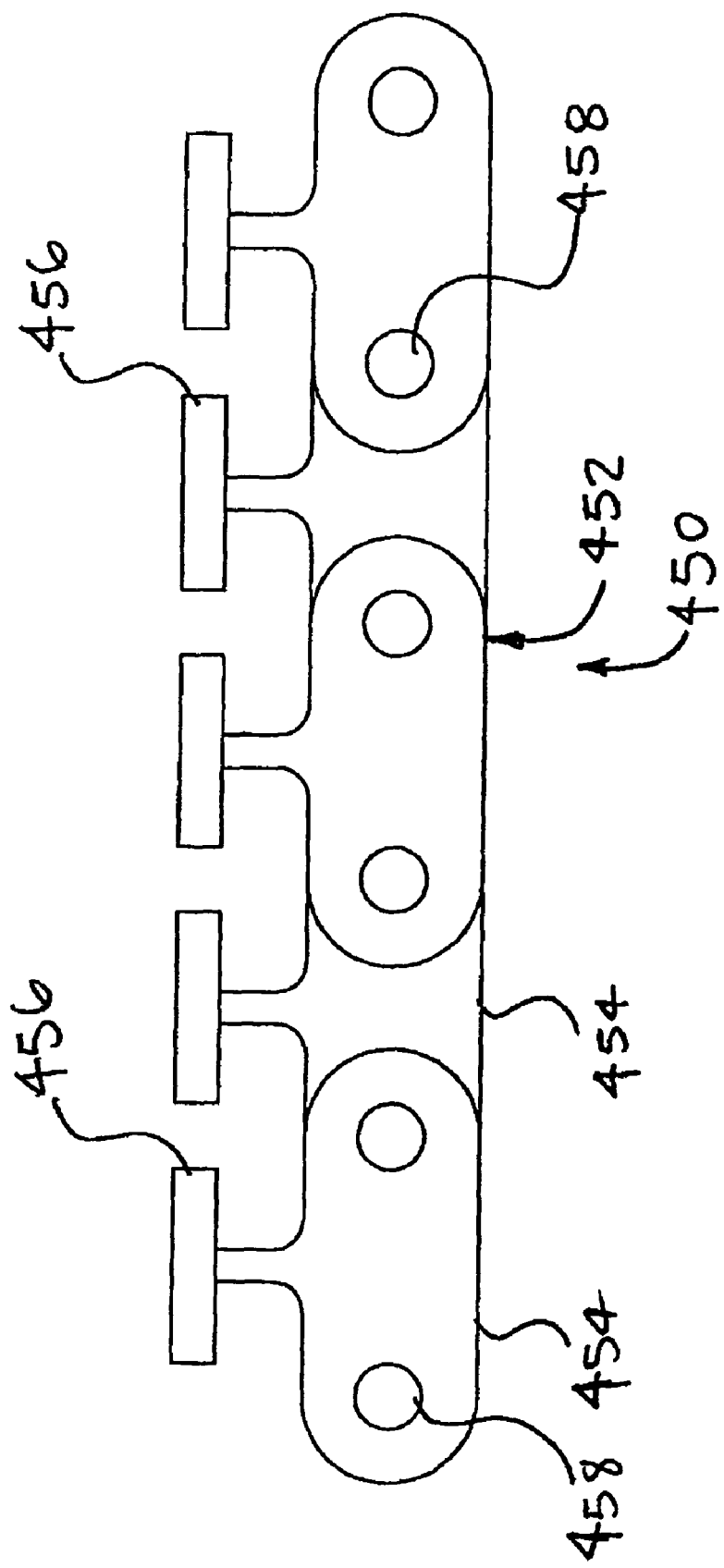
FIG. 4 is a side view showing a cord in accordance with an exemplary embodiment of the present invention.

FIG. 4 is a side view showing a cord 450 in accordance with one exemplary embodiment of the present invention. In the embodiment of FIG. 4, the cord 450 comprises a chain 452. The chain 452 comprises a plurality of links 454 pivotally coupled to one another by a plurality of pins 458. In the embodiment of FIG. 4, each link 454 preferably carries an optional substrate support 456. The supports 456, when provided, are adapted for supporting the substrate 306. In some embodiments, each support 456 comprises material that is particularly non-damaging to (e.g., not prone to marring) the substrate or the coating applied to the substrate's bottom surface 140.

Figure 5:
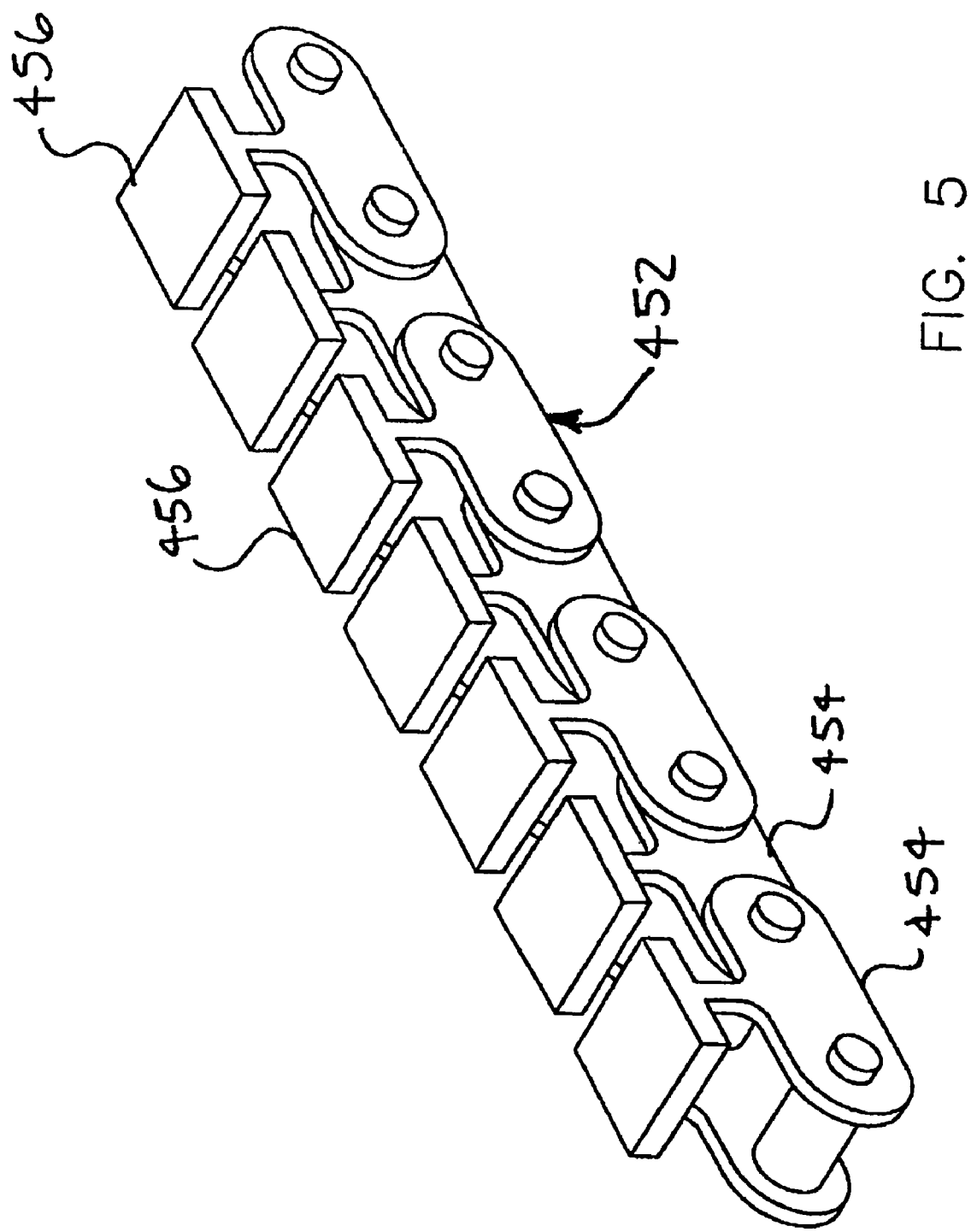
FIG. 5 is an isometric view of the cord shown in the previous figure.

FIG. 5 is an isometric view of a further length of the chain 452 shown in the previous figure. With reference to FIG. 5, it will be appreciated that each support 456 of the chain 452 comprises a top surface. This surface can optionally comprise, consist essentially of, consist of, and/or be defined by, carbon or a desired carbon-containing material. For example, a carbon or carbon-containing coating can optionally define the top surface of each support 456. A substrate can be supported by (e.g., on) the top surfaces of a plurality of the supports 456. As noted above, the links 454 of the chain 452 preferably carry (are joined to, are integral to, etc.) the supports 456.

Figure 6:
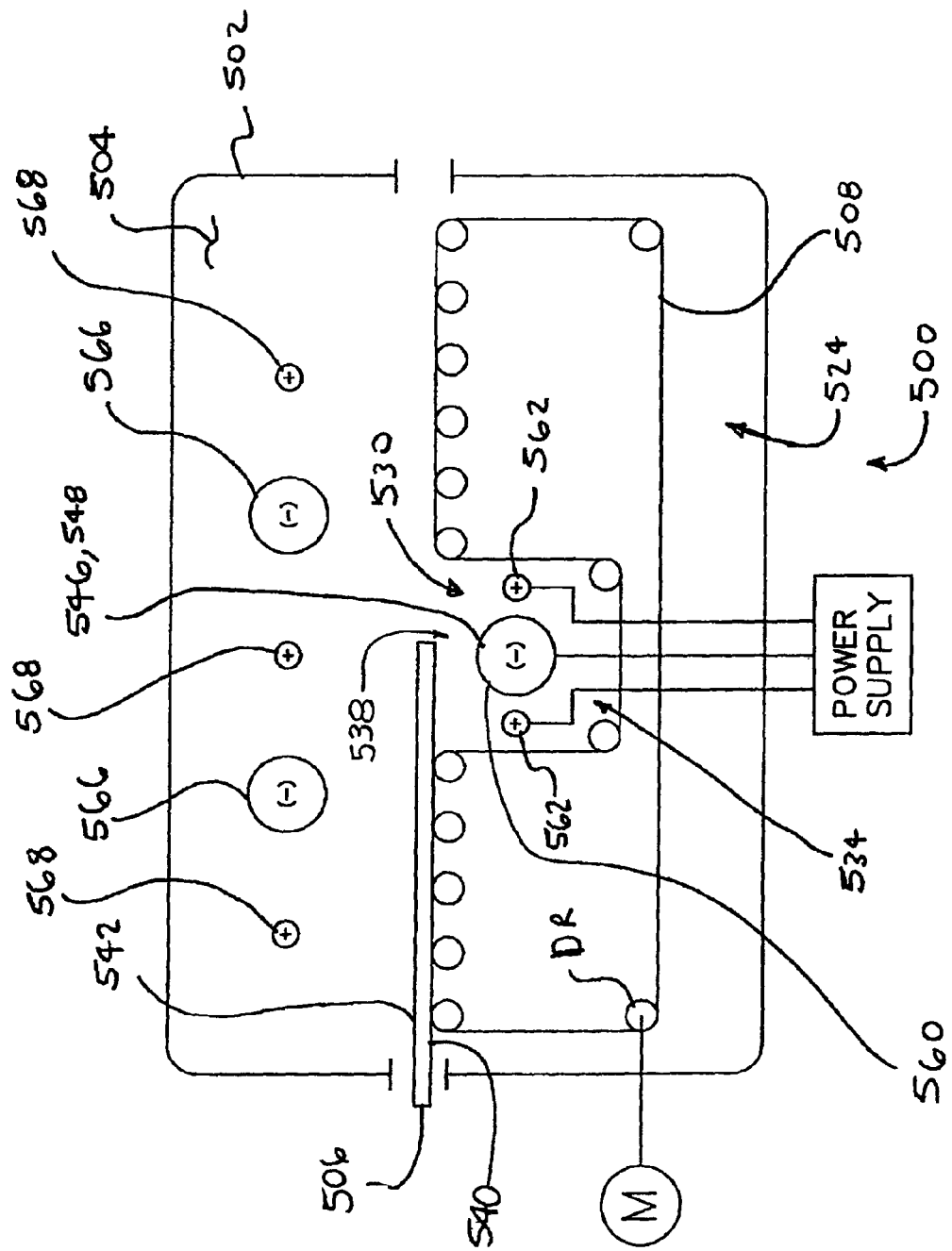
FIG. 6 is a somewhat diagrammatic side view of a coating system in accordance with an exemplary embodiment of the present invention.

FIG. 6 is a somewhat diagrammatic side view of a coating system or "coater" 500 in accordance with an exemplary embodiment of the present invention. Coating system 500 of FIG. 6 comprises a chamber 502 defining an interior cavity 504. In FIG. 6, a substrate 506 is shown resting on a conveyor loop 508 of a substrate transport system 524. A motor M is coupled to a drive roller DR for driving the conveyor loop 508. In this manner, the transport system 524 can be used to transport the substrate 506 through the chamber 502. The conveyor(s) of any embodiment described in the present disclosure can optionally be so motorized. The conveyor loop 508 can comprise various elements without deviating from the spirit and scope of the present invention. Examples of elements that can be used include; conveyor sheets, belts, cords, cables, straps, ropes, and chains.

In FIG. 6, the conveyor loop 508 defines a first pocket 530. A first coating material source 534 is disposed in the first pocket 530. In the embodiment of FIG. 6, the first coating material source 534 comprises a lower cathode 546. The lower cathode 546 can advantageously comprise a sputtering target 548. Preferably, the target 548 has a length, the overlying gap 638 has a length, and the target is positioned directly beneath the gap so that the target's length is generally parallel to the gap's length. This combination and relative positioning of a target and gap can optionally be provided with any embodiment of the invention. When provided, the target 548 can advantageously be a rotatable target, optionally comprising a tubular backing formed of an electrically conductive material (stainless steel, aluminum, etc.). Moreover, in certain embodiments, each lower source of coating material comprises a rotatable sputtering target, so as to minimize any impact of material falling onto such lower sources. The outer surface of such a target 548 preferably comprises (e.g., is defined by) a sputterable target material 560. The sputterable target material 560 can be any material that is adapted for being sputtered onto the substrate. The sputterable target material can be selected from the group consisting of silicon, zinc, tin, aluminum, silver, gold, copper, titanium, titanium oxide, niobium, and zirconium (or compounds including one or more of these materials). The sputterable target material can be a metallic material (e.g., pure metal) or an oxide, optionally a substoichiometric oxide such as $TiO_x$, where x is less than 2.

In FIG. 6, a plurality of optional lower anodes 562 are disposed in the first pocket 530. While at least one such anode is preferred in certain embodiments, other embodiments do not require any independent anode (e.g., dual AC targets can be provided, and optionally positioned in such a pocket). In the embodiment of FIG. 6, a power supply 564 is provided and operated to create a voltage differential between lower cathode 546 and lower anodes 562. Lower anodes 562 and lower cathode 546 are preferably adapted to (e.g., positioned and operated so as to) produce a stable plasma, which preferably is focused adjacent an exterior surface 560 of lower cathode 546 by a magnet assembly of the cathode.

With continued reference to FIG. 6, a plurality of upper cathodes 566 are disposed above the path of substrate travel. If so desired, a single upper cathode 566 can alternatively be provided. Material from each upper cathode 566 can be deposited on a second side (e.g., a second major surface) 542 of the substrate 506 to form a second coating. Preferably, the second side of the substrate is generally upwardly facing when it is being coated. With reference to FIG. 6, a plurality of optional upper anodes 568 are disposed above the path of substrate travel. In the embodiment of FIG. 6, an additional power supply can optionally be used to create a voltage differential between upper cathodes 566 and upper anodes 568. As with the lower cathode, the upper cathodes are not required to be provided with independent anodes. Further, in the embodiment of FIG. 6 (and in other embodiments), the coating system can include any number of upper coating material sources (e.g., upper coating devices). Likewise, any number of lower coating material sources (e.g., lower coating devices) can be provided. In certain embodiments, there is provided a deposition chamber in which only a lower (but not an upper) coating source (e.g., lower source 534 in FIG. 6, lower source 634 in FIG. 7, lower source 1634 in FIGS. 8-11, and lower source 134 in FIG. 13A) is provided.

Thus, certain methods of the invention involve applying thin films onto a sheet-like substrate. Some of these methods include: (1) providing a coater having a transport system defining a path of substrate travel extending through the coater, the substrate transport system including first and second conveyor loops separated by an upward coating deposition gap, the coater having a lower source of coating material positioned below such gap; (2) positioning the substrate on the first conveyor loop; (3) operating the transport system so as to convey the substrate along the path of substrate travel from the first conveyor loop to the second conveyor loop, such that the substrate during this conveyance moves over the lower source of coating material; and (4) operating the coater so as to deliver coating material upwardly from the lower source of coating material through the gap onto a bottom major surface of the substrate. In certain particularly advantageous methods of this nature, the operation of the lower source of coating material is performed in a lower region LR of a desired chamber DC of the coater, which desired chamber includes an upper region UR that either is equipped with no upper thin film deposition apparatus or is equipped with an upper deposition apparatus that is maintained in a non-depositing condition (i.e., in a condition where it is not being operated so as to emit coating material) during the operation of the lower source of coating material. For example, reference is made to FIG. 13A, which depicts one such desired chamber DC. In one particular method, the operation of the lower source of coating material is performed while an oxidizing atmosphere is maintained in the lower region of the desired chamber.

In the embodiment illustrated in FIG. 6, one preferred method for depositing coating on the first 540 and second 542 sides of the substrate 506 is by sputter deposition. It will be appreciated, however, that sputtering is not strictly required. Rather, the invention extends to a wide variety of coating methods. Examples of additional apparatuses and processes that are used in some embodiments include: ion-assisted deposition, chemical vapor deposition, physical vapor deposition, and/or vacuum evaporation.

Figure 7:
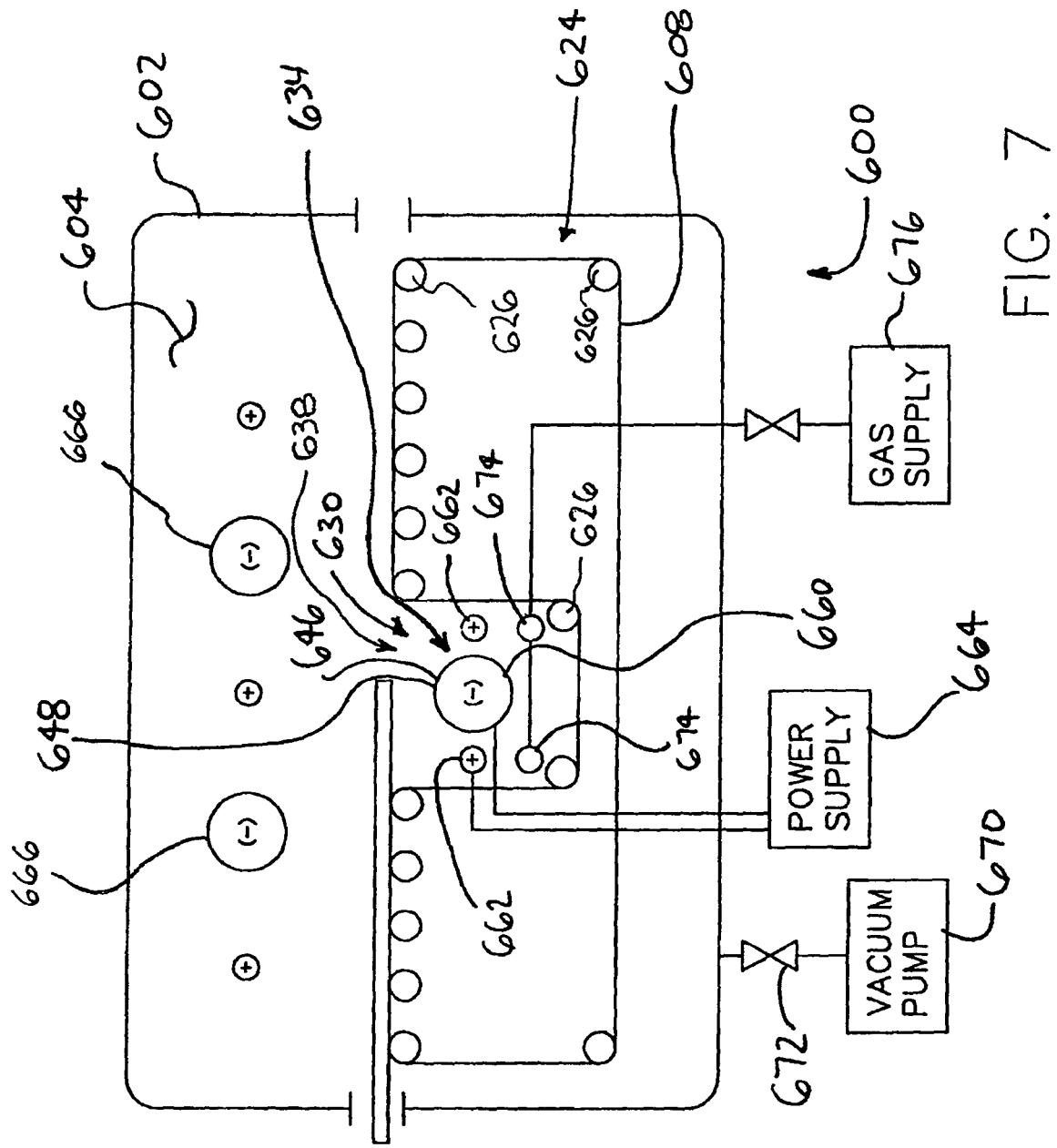
FIG. 7 is a somewhat diagrammatic side view of a coating system in accordance with an exemplary embodiment of the present invention.

FIG. 7 is a somewhat diagrammatic side view of a coating system 600 in accordance with an exemplary embodiment of the present invention. Coating system 600 comprises a chamber 602 defining an interior cavity 604. In some useful embodiments of the invention, the chamber 602 is capable of providing a controlled environment in the cavity 604. Preferably, the chamber 604 is adapted for establishing and maintaining a vacuous environment in the cavity 604. In the embodiment of FIG. 7, a vacuum pump 670 is connected with the cavity 604 of the chamber 602 via a valve 672. The vacuum pump 670 can be selectively placed in fluid communication with the interior cavity 604 of the chamber 602 for creating a below atmospheric pressure in the cavity 604. Conventional pumping systems comprising such vacuum pumps can be used to establish and maintain in the cavity a gas pressure within one or more of the pressure ranges described above.

In the embodiment of FIG. 7, a plurality of conduits 674 are disposed in a first pocket 630 defined by a conveyor loop 608 of a substrate transport system 624. In another embodiment, only one such conduit 674 is provided. In FIG. 7, conduits 674 are in fluid communication with the interior cavity 604 of the chamber 602 for delivering a gas to the cavity 604. The conduits 674 preferably are connected to a gas supply 676 via a valve in the embodiment of FIG. 7. Also in the embodiment of FIG. 7, a power supply 664 is optionally connected to a lower cathode 646 and a plurality of optional lower anodes 662. In some cases, the coating system 600 is used to carry out sputter deposition. To achieve a sputtering process, an electrical field can be created between the lower cathode 646 and the optional lower anodes 662. A gas, commonly an inert gas such as argon, or a mixture of inert and reactive gases, is introduced into the chamber 602 via the gas supply 676. Electrons in the electrical field are accelerated and gain enough energy to ionize gas atoms in the chamber 602 and create a plasma. Charged particles of the resulting plasma are then attracted to the lower cathode 646, as will be understood by skilled artisans.

In the embodiment of FIG. 7, the lower cathode 646 preferably comprises a sputtering target 648. When provided, the target 648 is preferably a rotatable target, optionally comprising a tubular backing formed of an electrically conductive material (stainless steel, aluminum, etc.). The outer surface of such a target 648 comprises (e.g., is defined by) a sputterable target material 660. The sputterable target material 660 can be any material that is adapted for being sputtered onto the substrate. The sputterable target material can be a metallic material or an oxide. In some embodiments, the target material is selected from the group of sputterable materials consisting of silicon, zinc, tin, aluminum, silver, gold, copper, titanium, titanium oxide, niobium, zirconium, and compounds including at least one of these materials. When charged plasma particles in the chamber 602 are attracted to such a target 648, they bombard the target and eject particles (e.g., atoms) of the sputterable material. In some applications, the charged plasma is maintained in a relatively narrowly defined area adjacent the target by a magnetic field (e.g., created by a magnet assembly behind or within the target).

Figure 8:
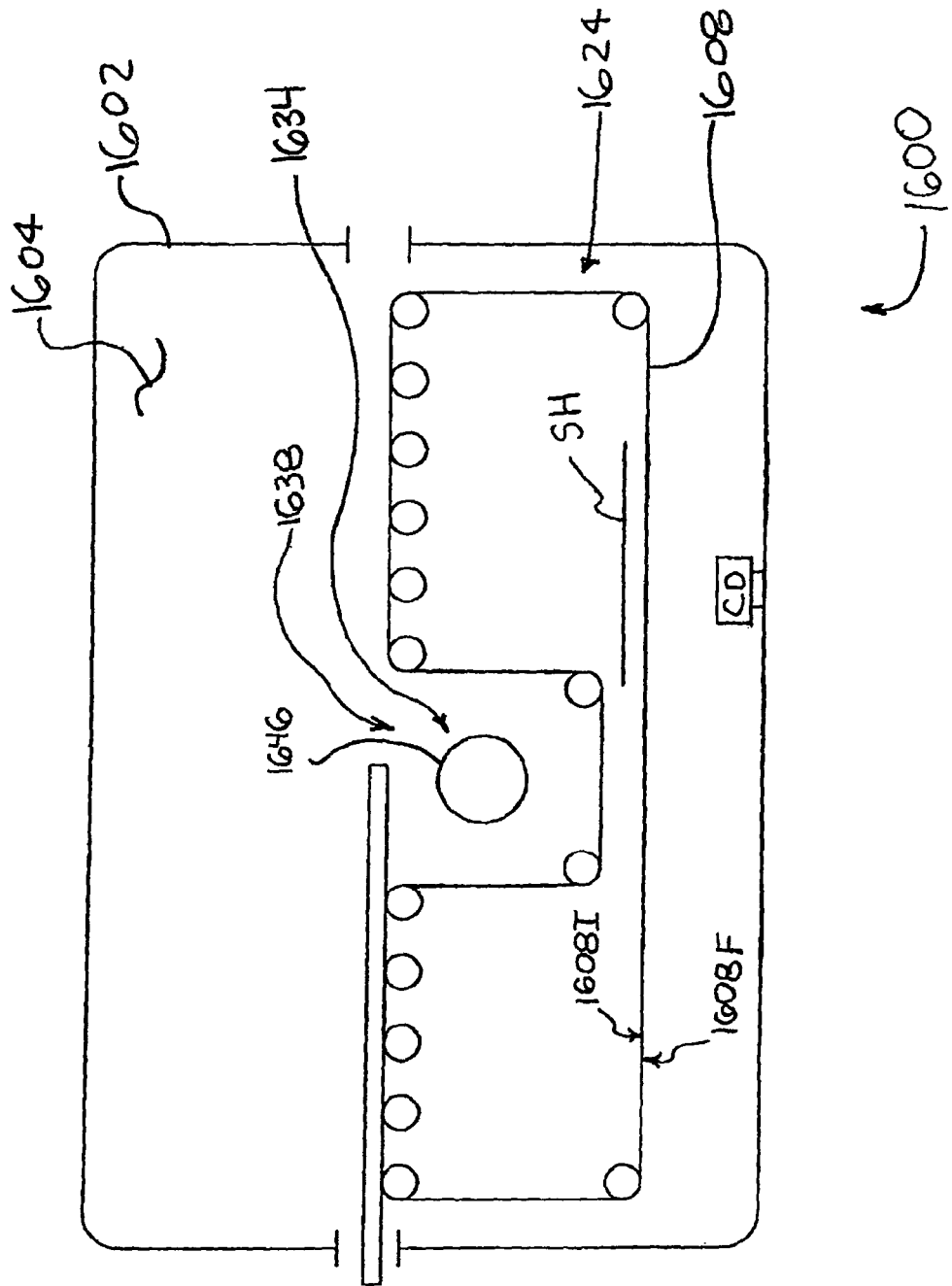
FIG. 8 is a somewhat diagrammatic side view of a coating system in accordance with an exemplary embodiment of the present invention.
Figure 9:
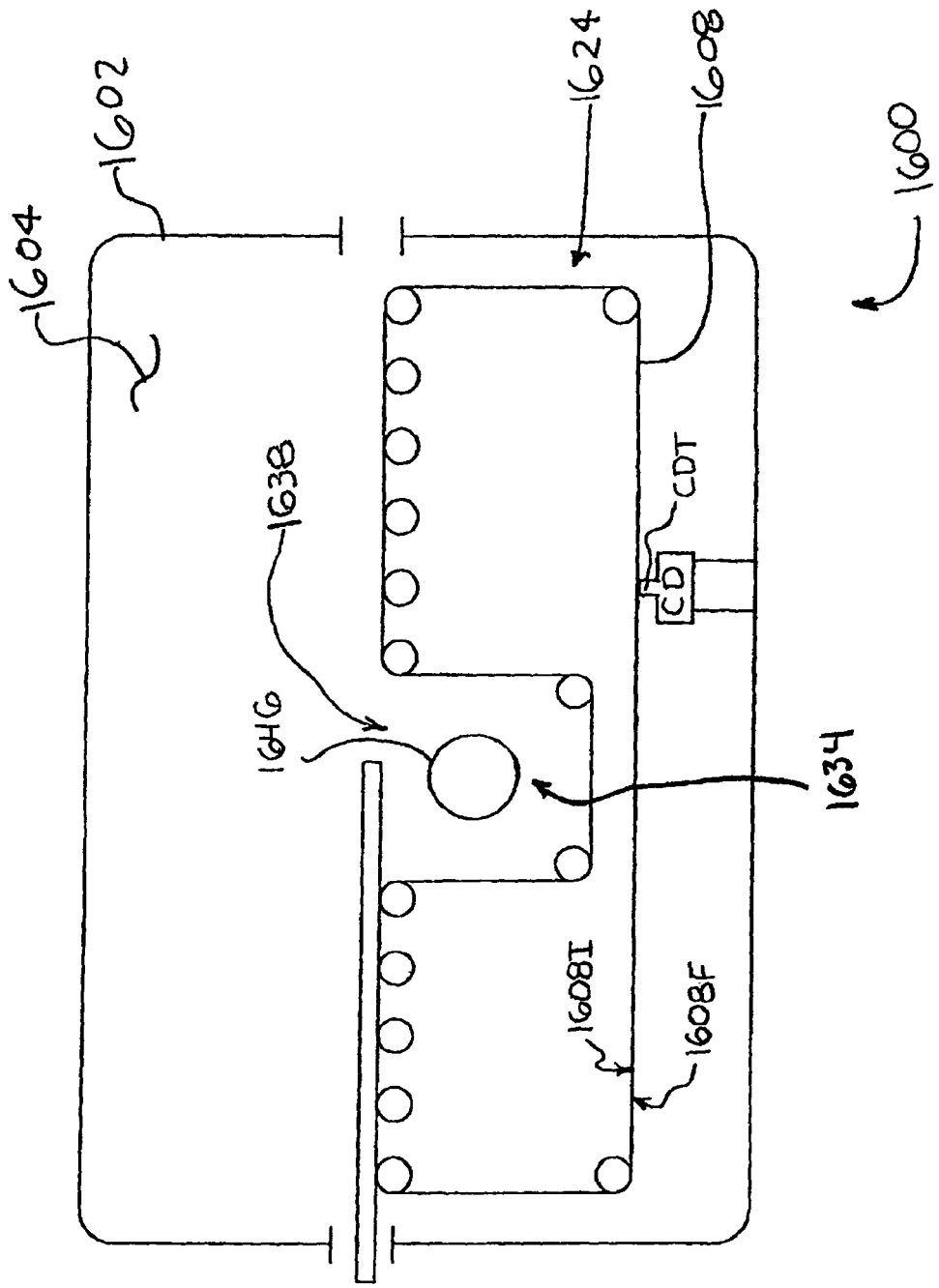
FIG. 9 is a somewhat diagrammatic side view of a coating system in accordance with an exemplary embodiment of the present invention.

FIGS. 8-10 depict various embodiments in which there is provided a coater 1600 having at least one lower source of coating material (optionally a rotatable sputtering target) 1646, a substrate conveyor 1608 having at least one upward coating deposition gap 1638, and at least one cleaning device CD adapted for removing overcoat from at least one surface of the conveyor 1608. The conveyor 1608 can comprise a variety of elements, such as those discussed above. Commonly, the conveyor 1608 comprises (e.g., is) a conveyor sheet or belt or a plurality of conveyor sheets or belts. Since one or more portions of the illustrated conveyor 1608 bound the upward coating deposition gap 1638, the working surface 1608F (i.e., the surface or "face" on which the substrate is conveyed, also sometimes referred to as the support surface 919) which is preferably oriented away from the rotatable bodies 626) of the conveyor is exposed to coating material that is delivered upwardly through the gap 1638. Some of this coating material lands upon the working surface of the conveyor 1608, leaving overcoat on the working surface of the conveyor. Thus, the embodiments of FIGS. 8-10 provide a cleaning device CD that is adapted for removing coating (e.g., physically) from the working surface (or "conveying surface") 1608F of the conveyor. In one embodiment, a conveyor cleaning device is provided in a chamber having only an operating downward coating device, optionally having no upward deposition gap in the chamber.

The cleaning device(s) CD, when provided, can each take various different forms. In FIG. 8, the illustrated cleaning device CD is mounted to a wall (e.g., a floor) of the chamber 602. In one embodiment of this nature, the cleaning device CD comprises an ion gun. In embodiments involving such an ion gun, the gun preferably is adapted for emitting ions (e.g., an ion beam) toward the conveyor 1608 (e.g., toward and against the working surface of a conveyor belt of the conveyor).

The cleaning device CD, when provided, can optionally comprise a scraper, brush, and/or tensioning device CDT in direct physical contact with the conveyor 1608. The scraper, brush, and/or tensioning device CDT can optionally be mounted to a wall of the chamber 1602, as shown in FIGS. 9 and 10. The scraper, brush, and/or tensioning device CDT in one embodiment comprises a rigid (e.g., metal or ceramic) body mounted in a stationary position so as to be in direct (e.g., kinetically frictional, when the conveyor is moving) contact with the conveyor (e.g., with the working surface 1608F of the conveyor). In another embodiment, the scraper, brush, and/or tensioning device CDT is a flexible body (optionally having an abrasive conveyor-contacting surface) mounted in a stationary position so as to be in direct kinetically frictional contact with a desired surface (e.g., the working or "conveying" surface 1608F) of the conveyor. The flexible body, when provided, can be a sponge-like abrasive pad, such as a sponge-cored sandpaper block.

FIG. 11 exemplifies an embodiment wherein the conveyor 1608 has an extended length so that overcoat building up on the conveyor is distributed over a particularly large working surface. In some embodiments of this nature, there is provided a conveyor belt having a length that is at least about 50%, 75%, 100%, or even 150% greater than would be required for a conveyor bed having a 180 degree conveyor wrap at each end of the conveyor bed. In certain embodiments of the invention, the conveyor travels around a generally horizontal row (or "bed") of upper rotatable bodies (or "carrying rotatable bodies") 626, which support the weight of the substrate during conveyance, and around one or more (preferably a plurality of) underside rotatable bodies 627, each positioned below such bed of carrying rotatable bodies 626. This is representative of a class of embodiments wherein the roller at each of two ends of a bed of carrying rollers has a conveyor wrap of less than 180 degrees. In the embodiment of FIG. 11, for example, the carrying body 626 at each end of each bed of each conveyor 1608 has a conveyor wrap of about 90 degrees. Thus, certain embodiments of the invention involve a coater having, in combination, at least one upward coating source (e.g., at least one upward coating device), an extended-surface-area conveyor (having any feature described in this paragraph, or any combination of the features described in this paragraph), and at least one upward coating deposition gap. In one such embodiment, the upward coating source comprises a sputtering target (e.g., a rotatable target, as would tend to shed itself of fallen particles due to its rotation).

It is to be understood that the apparatus and methods described herein can be used to apply coating onto one or both sides of a sheet-like substrate (e.g., a pane of glass) regardless of the nature of the coating(s) applied. For example, the apparatus can be used to apply anti-reflective coating onto one or both sides of a substrate, to apply infrared-reflective coating onto one or both sides of a substrate, or to apply water-sheeting coating, such as a photocatalytic coating, onto one or both sides of a substrate.

As noted above, certain embodiments of the invention allow a substrate to be provided with coating (regardless of composition) on both sides in a single pass of the substrate through the coater while the substrate is maintained in a constant orientation, i.e. wherein it does not need to be flipped, turned, or otherwise manipulated. This avoids the need to send the substrate through the coater, flip the substrate over, and send it back through the coater a second time. This enables a substrate having desired coatings on both sides to be produced in a particularly rapid and economical manner.

Substrates of various size can be used in the present invention. Commonly, large-area substrates are used. Certain embodiments involve a substrate having a major dimension of at least about 0.5 meter, preferably at least about 1 meter, perhaps more preferably at least about 1.5 meters (e.g., between about 2 meters and about 4 meters), and in some cases at least about 3 meters.

Substrates of various thickness can be used in the present invention. Commonly, substrates (e.g., glass sheets) with a thickness of about 1-5 mm are used. Certain embodiments involve a substrate with a thickness of between about 2.3 mm and about 4.8 mm, and perhaps more preferably between about 2.5 mm and about 4.8 mm. In some cases, a sheet of glass (e.g., soda-lime glass) with a thickness of about 3 mm is used.

Thus, the substrate involved in any embodiment (e.g., in any method or any coater-substrate assembly) can advantageously have a major dimension in any one or more of the noted major dimension ranges and/or a thickness in any one or more of the noted thickness ranges. In certain methods of present invention, the substrate is conveyed through the coater at a transport speed of about 100-500 inches per minute. In the drawings, roller bed conveyors are shown, although certain embodiments provide one or more slider bed conveyors.

Numerous characteristics and advantages of the invention covered by this document have been set forth in the foregoing description. It will be understood, however, that this disclosure is, in many respects, only illustrative. Changes may be made in details, particularly in matters of shape, size and ordering of steps without exceeding the scope of the invention. The invention's scope is, of course, defined by the language in which the appended claims are expressed.

What is claimed is:

1. A coater for applying thin films onto a sheet-like substrate, the coater having a substrate transport system adapted for conveying the substrate along a path of substrate travel extending through the coater, the substrate transport system including two conveyor loops separated by an upward coating deposition gap, at least one of the conveyor loops traveling around a generally horizontal row of upper rotatable bodies which support the weight of the substrate during conveyance, and traveling around one or more underside rotatable bodies during conveyance, the one or more underside rotatable bodies being positioned below the row of upper rotatable bodies such that upper rotatable bodies at each of two ends of the row of upper rotatable bodies have a conveyor wrap of less than 180 degrees, the coater having a source of coating material adapted for delivering coating material upwardly through said gap onto a bottom major surface of the substrate as the substrate is conveyed along a desired portion of the path of substrate travel, said desired portion of the path of substrate travel extending over the upward coating deposition gap.

2. The coater of claim 1, wherein each of said two conveyor loops comprises a conveyor sheet having a width of at least about 1 meter.

3. The coater of claim 1, wherein each of said two conveyor loops comprises a conveyor sheet having a width of at least about 2 meters.

4. The coater of claim 1, wherein each of said two conveyor loops comprises a conveyor sheet having generally-opposed lateral side edges between which the conveyor sheet forms a continuous wall devoid of gaps.

5. The coater of claim 1, wherein each of said two conveyor loops comprises a conveyor sheet having generally-opposed lateral side edges and having a major surface that is substantially entirely generally planar, such that when the bottom major surface of the substrate is positioned directly on said major surface there is a lateral extent of contact between said major surface and the substrate's bottom surface, said lateral extent of contact extending substantially entirely between the lateral side edges of the conveyor sheet.

6. The coater of claim 1, wherein at least part of the source of coating material is positioned directly beneath the upward coating deposition gap.

7. The coater of claim 1, wherein the coater includes a deposition chamber defining an interior cavity, the path of substrate travel extends through the deposition chamber, and said source of coating material is disposed at least in part within the deposition chamber.

8. The coater of claim 7, wherein the deposition chamber is a vacuum deposition chamber adapted for carrying out at least one vacuum deposition process.

9. The coater of claim 8, wherein the vacuum deposition chamber is adapted for establishing and maintaining a gas pressure in said interior cavity of less than about 0.1 torr.

10. The coater of claim 1, wherein said source of coating material includes a thin film deposition apparatus selected from the group consisting of a sputter deposition apparatus, an ion-assisted deposition apparatus, a chemical vapor deposition apparatus, and a vacuum evaporation apparatus.

11. The coater of claim 10, wherein said source of coating material includes a sputter deposition apparatus comprising a sputtering target.

12. The coater of claim 11, wherein the sputtering target has a length, the upward coating deposition gap has a length, and the target is positioned directly beneath said gap so that the target's length is generally parallel to the gap's length.

13. The coater of claim 11, further comprising a power supply adapted for delivering an electric charge to the sputtering target.

14. The coater of claim 1, wherein the coater is a large-area coater and the substrate transport system is adapted for conveying substrates each having a width of at least about 1.5 meters.

15. The coater of claim 1, wherein the coater is a large-area coater and the substrate transport system is adapted for conveying substrates each having a width of at least about 2 meters.

16. The coater of claim 1, wherein the coater is a large-area coater and said source of coating material comprises a sputtering target having a length of at least about 1 meter.

17. The coater of claim 1, wherein the coater is a large-area coater and said source of coating material comprises a sputtering target having a length of at least about 1.5 meters.

18. The coater of claim 1, wherein the upward coating deposition gap has a length, said source of coating material is adapted to deliver a flux of coating material, said flux having a length that is at least about 50% as great as the length of the upward coating deposition gap.

19. The coater of claim 1, wherein the upward coating deposition gap has a length, said source of coating material is adapted to deliver a flux of coating material, said flux having a length that is at least about 75% as great as the length of the upward coating deposition gap.

20. The coater of claim 1, wherein the substrate has a width, and the upward coating deposition gap has a length that is at least as great as the substrate's width.

21. The coater of claim 20, wherein said source of coating material is adapted for delivering a flux of coating material, said flux having a length that is at least as great as the substrate's width, such that said source of coating material is adapted for full-area coating of the bottom major surface of the substrate.

22. The coater of claim 1, wherein the substrate has a width, and said source of coating material is a sputtering target having a length that is at least about 70% as great as the substrate's width.

23. The coater of claim 1, wherein the substrate has a length, the upward coating deposition gap has a width, and the width of said gap is less than one half the length of the substrate.

24. The coater of claim 1, wherein at least one of the upper rotatable bodies at each of two ends of the row of upper rotatable bodies have a conveyor wrap of about 90 degrees.

25. A coater for applying thin films onto two generally-opposed major surfaces of a sheet-like substrate, the coater having a substrate transport system adapted for conveying the substrate along a path of substrate travel extending through the coater, the substrate transport system including two conveyor loops separated by an upward coating deposition gap, at least one of the conveyor loops traveling around a generally horizontal row of upper rotatable bodies which support the weight of the substrate during conveyance, and traveling around one or more underside rotatable bodies during conveyance, the one or more underside rotatable bodies being positioned below the row of upper rotatable bodies such that upper rotatable bodies at each of two ends of the row of upper rotatable bodies have a conveyor wrap of less than 180 degrees, the coater having an upper source of coating material positioned above the path of substrate travel and a lower source of coating material positioned below the path of substrate travel, said upper source being adapted for delivering coating material downwardly toward the path of substrate travel, said lower source being adapted for delivering coating material upwardly through said gap toward the path of substrate travel.

26. The coater of claim 25, wherein the coater includes a vacuum deposition chamber defining an interior cavity, the path of substrate travel extends through the vacuum deposition chamber, and the vacuum deposition chamber is adapted for establishing and maintaining a gas pressure in said interior cavity of less than about 0.1 ton.

27. The coater of claim 25, wherein said upper source of coating material comprises a sputtering target, and said lower source of coating material includes a thin film deposition apparatus selected from the group consisting of a sputter deposition apparatus, an ion-assisted deposition apparatus, a chemical vapor deposition apparatus, and a vacuum evaporation apparatus.

28. The coater of claim 25, wherein the coater includes a series of thin film deposition apparatuses positioned on a common side of the path of substrate travel such that the deposition apparatuses of said series are either above or below the path of substrate travel, the deposition apparatuses of said series being adapted to deposit a low-emissivity coating on the substrate.

29. The coater of claim 28, said series of deposition apparatuses including at least one apparatus adapted for depositing a silver-containing film on the substrate.

30. The coater of claim 28, wherein the deposition apparatuses of said series are positioned above the path of substrate travel.

31. The coater of claim 28, wherein said series of deposition apparatuses includes sputtering targets.

32. The coater of claim 25, wherein at least one of the upper rotatable bodies at each of two ends of the row of upper rotatable bodies have a conveyor wrap of about 90 degrees.

33. A coater for applying thin films onto a sheet-like substrate, the coater comprising:

a substrate transport system adapted for conveying the substrate through the coater, the substrate transport system having a conveyor loop defining a pocket; and a source of coating material disposed at least partially within the pocket defined by the conveyor loop of the substrate transport system.

34. The coater of claim 33, wherein the substrate transport system defines a path of substrate travel extending through the coater, and said source of coating material is below the path of substrate travel.

35. The coater of claim 33, wherein said pocket is open upwardly toward the path of substrate travel, and said source of coating material is adapted for delivering coating material upwardly onto a bottom major surface of the substrate when the substrate is in a desired position on the transport system.

36. The coater of claim 33, wherein the substrate has a width, and the pocket has a length that is at least as great as the substrate's width.

37. The coater of claim 36, wherein said source of coating material is adapted for delivering a flux of coating material, said flux having a length that is at least as great as the substrate's width, such that said source of coating material is adapted for full-area coating of a bottom major surface of the substrate.

38. The coater of claim 36, wherein said source of coating material is a sputtering target having a length that is at least about 70% as great as the substrate's width.

39. The coater of claim 33, wherein the substrate has a length, the pocket has a width, and the width of the pocket is less than one half the length of the substrate.

40. The coater of claim 33, wherein the coater includes a deposition chamber defining an interior cavity, the substrate transport system defines a path of substrate travel extending through the deposition chamber, and said source of coating material is disposed at least in part within the deposition chamber.

41. The coater of claim 40, wherein the deposition chamber is a vacuum deposition chamber adapted for carrying out at least one vacuum deposition process.

42. The coater of claim 41, wherein the vacuum deposition chamber is adapted for establishing and maintaining a gas pressure in said interior cavity of less than about 0.1 torr.

43. The coater of claim 33, wherein said source of coating material includes a thin film deposition apparatus selected from the group consisting of a sputter deposition apparatus, an ion-assisted deposition apparatus, a chemical vapor deposition apparatus, and a vacuum evaporation apparatus.

44. The coater of claim 43, wherein said source of coating material includes a sputter deposition apparatus comprising a sputtering target.

45. The coater of claim 44, wherein the sputtering target is disposed at least partially within the pocket defined by the conveyor loop of the substrate transport system.

46. The coater of claim 45, further comprising a gas-delivery outlet disposed within the pocket defined by the conveyor loop of the substrate transport system.

47. The coater of claim 46, further comprising a gas supply coupled with, and/or adapted for being coupled with, a gas-delivery line leading to the gas-delivery outlet.

48. The coater of claim 45, further comprising an anode disposed at least partially within the pocket defined by the conveyor loop of the substrate transport system.

49. The coater of claim 48, further comprising a power supply for providing a voltage differential between the sputtering target and the anode.

50. The coater of claim 33, wherein the pocket is bounded by a generally-horizontal portion of the conveyor loop and by two generally-vertical confronting portions of the conveyor loop.

51. A coater for applying thin films onto two generally-opposed major surfaces of a sheet-like glass substrate having a major dimension of at least 1 meter, the coater having a substrate transport system adapted for conveying the glass substrate along a path of substrate travel extending through the coater, the substrate transport system having a conveyor with an upward coating deposition gap, at least one of the conveyor loops traveling around a generally horizontal row of upper rotatable bodies which support the weight of the substrate during conveyance, and traveling around one or more underside rotatable bodies during conveyance, the one or more underside rotatable bodies being positioned below the row of upper rotatable bodies such that upper rotatable bodies at each of two ends of the row of upper rotatable bodies have a conveyor wrap of less than 180 degrees, the coater including an upper source of coating material positioned above the path of substrate travel and a lower source of coating material positioned below the path of substrate travel, said upper source being adapted for delivering coating material downwardly toward the path of substrate travel, said lower source being adapted for delivering coating material upwardly through said gap toward the path of substrate travel, wherein the upper source of coating material comprises a sputtering target, and the lower source of coating material includes a thin film deposition apparatus selected from the group consisting of a sputter deposition apparatus, an ion-assisted deposition apparatus, a chemical vapor deposition apparatus, and a vacuum evaporation apparatus.

52. The coater of claim 51, wherein said conveyor includes two conveyor loops separated by said upward coating deposition gap, wherein each conveyor loop comprises a conveyor sheet.

53. The coater of claim 51, wherein at least one of the upper rotatable bodies at each of two ends of the row of upper rotatable bodies have a conveyor wrap of about 90 degrees.

* * * * *